United States Patent
Sasakura et al.

(10) Patent No.: US 7,131,013 B2
(45) Date of Patent: Oct. 31, 2006

(54) POWER SUPPLY CONTROL SYSTEM AND STORAGE DEVICE FOR HOLDING DATA JUST PRIOR TO THE OCCURENCE OF AN ERROR

(75) Inventors: Takahiro Sasakura, Chigasaki (JP); Seiichi Abe, Odawara (JP)

(73) Assignee: Hitachi, Ltd., Tokyo (JP)

( * ) Notice: Subject to any disclaimer, the term of this patent is extended or adjusted under 35 U.S.C. 154(b) by 239 days.

(21) Appl. No.: 10/871,279

(22) Filed: Jun. 21, 2004

(65) Prior Publication Data
US 2005/0240814 A1    Oct. 27, 2005

(30) Foreign Application Priority Data
Apr. 8, 2004    (JP)    .............................. 2004-113829

(51) Int. Cl.
G06F 1/30    (2006.01)
H02H 9/00    (2006.01)
(52) U.S. Cl. .......................... 713/300; 713/340; 361/18
(58) Field of Classification Search ................ 713/300, 713/340; 361/18; 323/284
See application file for complete search history.

(56) References Cited

U.S. PATENT DOCUMENTS

| | | | |
|---|---|---|---|
| 4,847,720 A * | 7/1989 | Dezonno ..................... | 361/18 |
| 5,047,751 A * | 9/1991 | Miura et al. ................. | 340/661 |
| 5,448,719 A | 9/1995 | Schultz et al. | |
| 5,574,697 A | 11/1996 | Manning | |
| 5,635,824 A * | 6/1997 | Noguchi ..................... | 323/284 |
| 5,798,961 A | 8/1998 | Heyden et al. | |
| 5,818,780 A | 10/1998 | Manning | |
| 5,946,270 A * | 8/1999 | Jang ............................ | 367/18 |
| 6,009,034 A | 12/1999 | Manning | |
| 6,225,911 B1 * | 5/2001 | Nagamasa et al. .......... | 340/635 |
| 6,307,802 B1 | 10/2001 | Manning | |
| 6,336,174 B1 | 1/2002 | Li et al. | |

(Continued)

FOREIGN PATENT DOCUMENTS

JP    07327316 A * 12/1995

(Continued)

OTHER PUBLICATIONS

Hitachi Global Storage Technologies, "Fibre Channel-Arbitrated Loop: A Cost-Effective, High-Performance Hard Disk Drive Interface", 6 pages.

(Continued)

*Primary Examiner*—Chun Cao
*Assistant Examiner*—Suresh K Suryawanshi
(74) *Attorney, Agent, or Firm*—Reed Smith LLP; Stanley P. Fisher, Esq.; Juan Carlos A. Marquez, Esq.

(57) ABSTRACT

A computing section controls a hot swap circuit, and DC/DC converters based on binary data from an ADC and an interrupt signal from respective comparing sections of a voltage detecting circuit. If the interrupt signal is input from any one of the respective comparing sections, the reading of binary data corresponding to the interrupt signal is halted. The binary data relating to the voltage detecting section corresponding to the interrupt signal, which is held in the SRAM at that time, is transferred to a non-volatile memory, where it is stored. When driving of the system has been halted, binary data is read out from the non-volatile memory, in order to analyze the cause of the error in a DC/DC converter which indicates an error output voltage from one of power supply circuits for supplying externally a plurality of different drive voltages to loads in a disk array unit.

10 Claims, 14 Drawing Sheets

U.S. PATENT DOCUMENTS 6,552,934 B1     4/2003    Roohparvar
6,681,339 B1     1/2004    McKean et al.

FOREIGN PATENT DOCUMENTS

JP       2000-188829     12/1998

JP       2003158782 A    *    5/2003

OTHER PUBLICATIONS

Primergy L200 Server System (See Section 7, p. 55, "System Components and Expansion", Nov. 2002, 74 pages.

* cited by examiner

US 7,131,013 B2

POWER SUPPLY CONTROL SYSTEM AND STORAGE DEVICE FOR HOLDING DATA JUST PRIOR TO THE OCCURENCE OF AN ERROR

CROSS-REFERENCE TO PRIOR APPLICATION

This application relates to and claims priority from Japanese Patent Application Nos. 2004-113829, filed on Apr. 8, 2004 the entire disclosure of which are incorporated herein by reference.

BACKGROUND OF THE INVENTION

1. Field of the Invention

The present invention relates to a power supply control system comprising a plurality of power supply circuits which supply powers to loads driven at a plurality of voltages, at voltages corresponding respectively to the plurality of voltages, and to a storage device comprising a disk drive unit for storing input data, and a cache memory which temporarily keeps the data stored in the disk drive unit.

2. Description of the Related Art

In the prior art, a power sequence detecting unit has been proposed with the aim of shortening the time required until the cause of an operational fault can be identified, in cases where an operational fault occurs in the power supply section, due to an error in the power supply sequence that cannot be fully detected. In such as device, the power supply control section controls the start-up of the power supply output of three power supply units, for example, and at the start-up timing, the output power voltages of the respectively power supply units are compared with a previously determined prescribed value, and logic signals based on these comparisons are output by respective comparators and the NOR circuit. In accordance with the output of these logic signals, a distinction can be made between a normal and error state of the power output of the three power supply units. Therefore, if there is an error in the power supply sequence, the suspect power supply unit can be identified, and the source of an operational fault caused by an error in the power supply sequence can be detected at an early stage (see, for example, Japanese Patent Laid-open No. 2000-188829).

Conventionally, almost all LSIs (large-scale integrated circuits) used in electronic devices have required a 5V DC (direct current), but in recent years, with miniauthorization of the manufacturing process for LSIs, there have appeared LSIs requiring voltages of 3.3V DC, 2.5V DC, 1.8V DC, 1.5V DC, or the like, for example, other than 5V DC. Furthermore, with miniauthorization in the manufacturing process for LSIs, in many LSIs, the DC voltage applied to each chip inside the LSI and the DC voltage applied to the I/O (input/output) section of the LSI are different, and in an increasing number of LSIs, the power input sequence to each LSI is specified, in order to prevent breakdown of the element. In view of this technological background, power supply sequence circuits which are conventionally constituted by discrete components are becoming increasingly complex in structure, in order to respond to the various demands brought by miniaturization of the LSI manufacturing process as described above.

However, the aforementioned power supply control LSI is only provided with a function for performing simple sequence control, and although no problem will arise when the power supply circuit section subject to control is operating in a normal state, if the power supply circuit section declines into an error state, for some reason or other, then the voltage value immediately prior to entering this error state is unknown, and therefore, it is difficult to carry out fault analysis of the power supply circuit section by means of the power supply control LSI described above.

Furthermore, in a storage system comprising a disk array unit constituted by a plurality of storage devices arranged in an array configuration, such as a RAID (Redundant Array of Independent Inexpensive Disks), for example, the process for halting the drive power is complex and varied depending on the type of incident occurring in the system, and hence more detailed control is required and a power supply control LSI such as that described above is not capable of providing a suitable response.

SUMMARY OF THE INVENTION

Therefore, it is a first object of the present invention to enable fault analysis of a power supply circuit section to be carried out, in the event that a power supply circuit section enters an error state, by storing a record of the variation in the voltage value data prior to its entering an error state.

Furthermore, it is a second object of the present invention to enable more precise control to be carried out, in accordance with a process for halting the power supply which differs depending on the incident arising, in a storage system comprising disk array units, and the like.

The power supply control system according to a first aspect of the present invention comprises: a plurality of power supply circuits for supplying a plurality of voltages to loads driven at the plurality of voltages, respectively; a data holding section for holding detected output voltage value data from each of the power supply circuits, separately for each of the power supply circuits, until the data is updated by means of newly detected output voltage value data from each of the power supply circuits; an error reporting section for checking whether or not the output voltage from each of the power supply circuits is abnormal, separately for each of the power supply circuits, and outputting an error report signal in such a manner that it can be identified in which power supply circuit the error occurred if there is a power supply circuit which is judged to be abnormal; and a data update prohibiting section for prohibiting updating of the output voltage value data in the data holding section, if the error report signal is output by the error reporting section, and storing the output voltage value data prior to the occurrence of the error, in a storage section.

In a preferred embodiment relating to the first aspect of the present invention, output voltage value data of at least the number of cycles required to analyze an error occurring in any one of the power supply circuits, which is sampled at a prescribed frequency of cycles, is stored in the data holding section.

In a preferred embodiment, the data holding section and the storage section are the same storage media, or separate storage media, and the storage section is a non-volatile memory.

Moreover, a preferred embodiment also comprises: a plurality of voltage detecting sections for detecting the output voltage from each of the power supply circuits, provided respectively for each of the power supply circuits; wherein the error reporting section and the respective voltage detecting sections are respectively connected by a signal transmission path.

Moreover, in a preferred embodiment, the error reporting section judges whether or not an error has occurred in any one of the power supply circuits, by comparing the output voltage value data transmitted from each of the voltage detecting sections via the respective signal transmission paths, with voltage threshold value data corresponding to each of the output voltage value data, of voltage threshold value data for judging whether or not the output voltage value data set separately for each of the power supply circuits is abnormal.

Furthermore, in a preferred embodiment, the abnormality reporting section and the data update prohibiting section are connected by means of a plurality of signal transmission paths provided corresponding to each of the aforementioned signal transmission paths connecting the error reporting section respectively with each of the voltage detecting sections.

Moreover, in a preferred embodiment, if the output voltage value data transmitted from any one of the voltage detecting sections via the signal transmission path corresponding to the voltage detecting section is judged to be abnormal, the error reporting section transmits the error report signal to the data update prohibiting section via the signal transmission path corresponding to the signal transmission path, of the plurality of signal transmission paths connecting the error reporting section and the data update prohibiting section.

Moreover, in a preferred embodiment, the driving of each of the power supply circuits is halted in a sequence whereby no damage is caused to the elements of the host control circuit which is the load, if the data update prohibiting section inputs an error report signal from the abnormality reporting section.

Moreover, in a preferred embodiment, the data update prohibiting section reports the fact that an error has occurred in any one of the power supply circuits, to the host control circuit or the host circuit board, which is the load, if the data update prohibiting section inputs an error report signal from the error reporting section.

Moreover, a preferred embodiment further comprises: a temperature detecting section for detecting the temperature inside the system; and a fan for cooling the interior of the system; wherein the startup of the fan, increase in the rotational speed of the fan, and halting of the respective driving of the power supply circuits, are controlled stepwise, in accordance with the temperature detection value from the temperature detecting section.

The storage device according to a second aspect of the present invention is a storage device comprising a disk drive unit for storing input data, and a cache memory for temporarily holding the data stored in the disk drive unit, comprising: a plurality of redundant power supply circuits, for receiving a power supply from a power source, and supplying drive power at the same voltage, respectively, to each section of the storage device; a back-up power supply whereby each section of the storage device comprising at least the disk drive unit and the cache memory can be backed up, via the plurality of power supply circuits; a data transfer system for transferring data held in the cache memory, to the disk drive unit, if the power source has been interrupted; and a control section for controlling each of the power supply circuits in such a manner that, if the power source has been interrupted, the supply of power to the respective sections constituting the data transfer system, from the back-up power supply, via the plurality of redundant power supply circuits, is only carried out via a single power supply circuit, until the data transfer has been completed.

In a preferred embodiment of the second aspect of the present invention, at least one of the pluralities of redundant power supply circuits is constituted in such a manner that the output voltage can be reduced until the minimum voltage value permitting operation of the load.

Moreover, in a preferred embodiment, the control section halts the power supply circuit being driven, when the data transfer has been completed.

The storage device according to a third aspect of the present invention comprises: a disk drive unit for storing data input from an information processing device, and a cache memory for temporarily holding the data stored in the disk drive unit; the cache memory being divided physically into a write region for temporarily holding data input from the information processing device and a read region for temporarily holding data transferred from the disk drive unit; and comprising: a data transfer system for transferring data held in the write region, to the disk drive unit, if the power source has entered an interrupted state; a back-up power supply whereby each section of the storage device comprising at least the disk drive unit and the cache memory can be backed up;

and a control section for controlling the supply of power from the back-up power supply, such that power is supplied only to the write region and the data transfer system, if the power source has been interrupted.

A preferred embodiment of the third aspect of the present invention further comprises: a shared memory for storing address information for the write region and address information for the read region; wherein the control section also supplies power from the back-up power supply to the shared memory, if the power source has been interrupted.

The storage device according to a fourth aspect of the present invention is a storage device comprising a disk drive unit for storing input data, and a cache memory for temporarily holding the data stored in the disk drive unit, comprising: a plurality of data transfer systems for transferring data held in the cache memory, to the disk drive unit, if the power source has entered an interrupted state; a back-up power supply whereby each section of the storage device comprising at least the disk drive unit and the cache memory can be backed up; and a control section for performing control, if the power source is interrupted, in such a manner that power from the back-up power supply is only supplied to the data transfer system which is to actually transfer the data held in the cache memory, to the disk drive unit.

The control method for a storage device according to a fifth aspect of the present invention is a control method for a storage device comprising a disk drive unit for storing input data, and a cache memory for temporarily holding the data stored in the disk drive unit, having the steps of: a first step of starting up a power supply circuit for receiving a power supply from a power source, and supplying a drive voltage at a prescribed voltage to each of the sections of the storage device; a second step of executing normal control for controlling the respective sections by supplying a drive power at a prescribed voltage to each of the sections of the storage device, from the power supply circuit; a third step of executing a data transfer instruction, if an instruction for transferring data held in the cache memory to the disk drive unit has been issued, due to the power source having been interrupted in the second step; a fourth step of issuing a prescribed warning to a control device situated at a higher level than the storage device, if an error of any kind has occurred in the storage device in the third step, or if there is no response from the respective sections of the storage device required in order to carry out the second step; a fifth step of halting the driving of the storage device, if a drive halting instruction has been issued by the control device situated at a higher level, during execution of the second step, or if the third step has been executed normally.

In a preferred embodiment of the fifth aspect of the present invention, the method advances immediately to the fourth step, if an error in the output voltage from the power supply circuit has occurred during execution of the first step.

Moreover, in a preferred embodiment, if a circuit board installed with at least a computing section for executing the respective steps has been removed from the storage device, during the execution of the second step, then the method advances to a sixth step of halting the driving of the storage device, in a restartable state.

Moreover, in a preferred embodiment, if an error of any kind has occurred in the storage device during execution of the sixth step, or if there is no response from the respective sections of the storage device required in order to execute the second step, then the method advances to the fourth step.

Moreover, in a preferred embodiment, if an error of any kind has occurred in the storage device during execution of the first step, or if there is no response from the respective sections of the storage device required in order to execute the first step, then the method advances to the fourth step.

DESCRIPTION OF THE PREFERRED EMBODIMENTS

Below, an embodiment of the present invention is described in detail with reference to the drawings.

Figure 1:
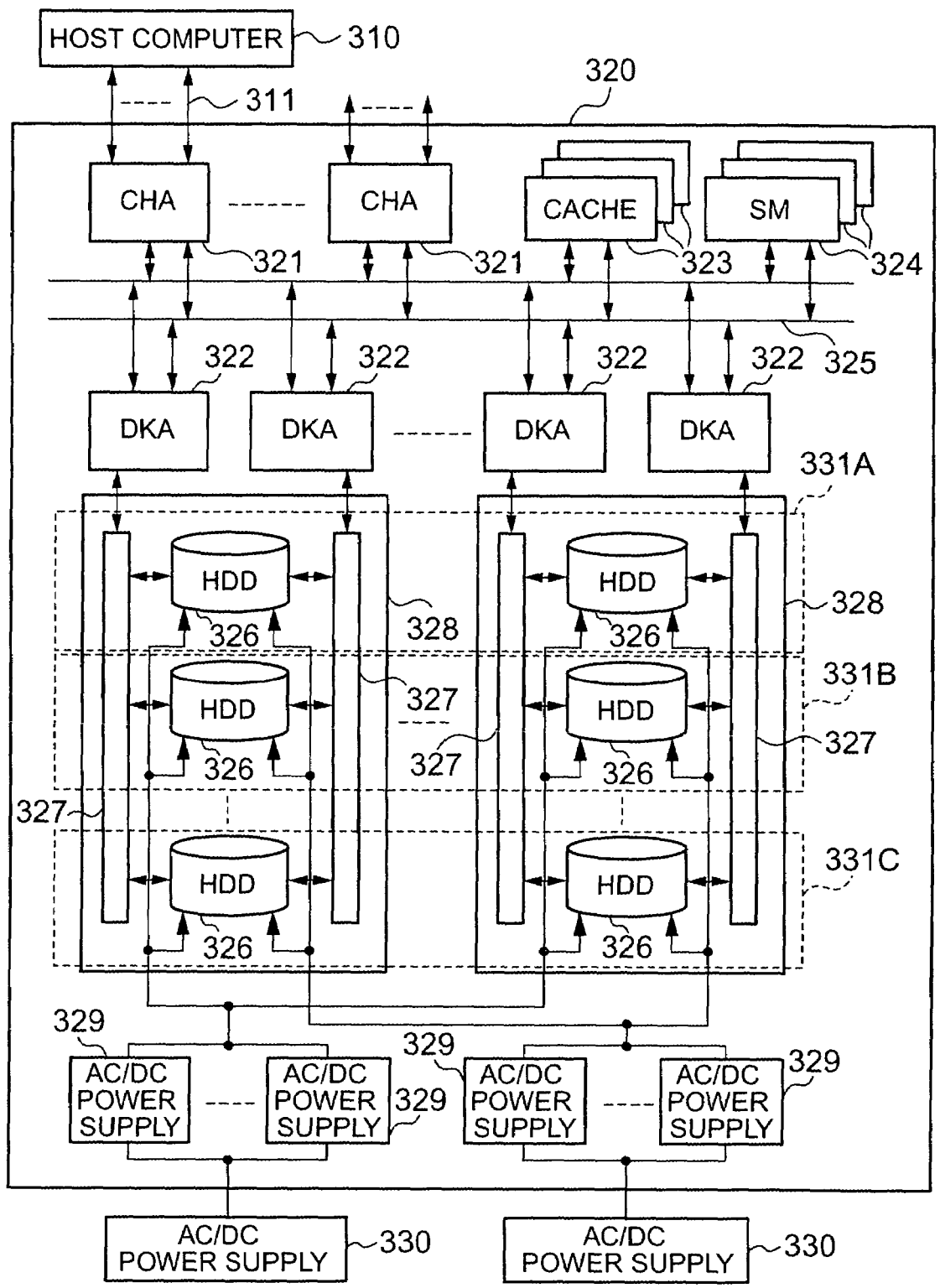
FIG. 1 is a block diagram showing the general composition of a storage system to which the present invention is applied.

FIG. 1 is a block diagram showing the general composition of a storage system to which the present invention is applied.

The storage system 320 illustrated in FIG. 1 comprises one or more channel adapters (CHA) 321, one or more disk adapters (DKA) 322, one or more cache memories (CACHE) 323, one or more shared memories (SM) 324, one or more common buses 325, a plurality of physical storage devices 326, one or more connection control circuits 327, one or more motherboards 328, and one or more main power supply circuits 329. For the physical storage devices 326, it is possible to use a hard disk drive, a non-volatile semiconductor memory, or a device of another type, but typically, a hard disk drive (hereinafter, called "HDD") is used. In the following description, it is assumed that HDDs are used.

The channel adapters 321, disk adapters 322, cache memories 323 and shared memories 324 are mutually connected by means of a common bus 325. A dual-level (or multiple-level) system may be employed for the common bus 325, as shown in the drawings, in order to protect against faults in the common bus 325. The channel adapters 321 are connected to one or more host computer 310, or to a further storage system (not illustrated) by means of a connecting line 311. The channel adapters 321 control the transfer of data between a host computer 310 or other storage system (not illustrated) and a cache memory 323. The disk adapters 322 control the transfer of data between a cache memory 323 and a HDD 326. The cache memory 323 is a memory for temporarily holding data received from the host computer 310 or other storage system (not illustrated), or data read out from the HDD 326. The shared memory 324 is a memory which is shared by all of the channel adapters 321 in the storage system 320, and by all of the disk adapters 322. The shared memory is principally used to store various types of information for control and management purposes, which are used by the channel adapters 321 and the disk adapters 322.

The motherboard 328 is an electrical circuit board comprising a wiring pattern for data transfer for the HDDs 326 and a wiring pattern for supplying power. Each motherboard 328 is fitted with two (or more than two) connection control circuits 327 with which a plurality of HDDs 326 are mutually interchangeable. Each of the two connection control circuits 327 on each motherboard 328 connects a plurality of HDDs 326 on that motherboard 328 with each of the two mutually interchangeable disk adapters 322, in a communicable fashion, and a fiber channel switch or a port bypass circuit, or the like, is used for same, for example. The respective connection control circuits 327 and the plurality of HDDs 326 are electrically connected by means of a wiring pattern on the respective motherboards 328. Furthermore, the respective connection control circuits 327 and the respective disk adapters 322 are electrically connected by means of a multi-wire cable, for example. Data is transferred between the plurality of HDDs 326 and the respective disk adapters 322 by means of the respective connection control circuits 327. Security with respect to faults is improved by doubling up sets of connection control circuit 327 and disk adapter 322, for each of the motherboards 328. As described more specifically hereinafter, the HDDs 326 are accommodated in canisters (in other words, frames) which are installed detachably on the motherboard 328, and the pack of HDDs 326 accommodated in a canister or frame of this kind may be called an "HDD pack" or an "HDD frame". In the following description, the term "HDD pack" is used.

The reference numbers 331A, 331B, 331C respectively indicate a group of HDDs 326 based on the principle of a RAID, which is called a parity group (or an error collection group) based on the RAID principle. The two or more HDDs 326 belonging to the same parity group 331A, 331B or 331C are mounted on different motherboards, and data is stored in a redundant fashion, in such a manner that, if one of the HDDs 326 develops a fault, then the data of the faulty HDD 326 can be restored by means of the data in the other HDD 326. Desirably, the two or more HDDs 326 belonging to the same parity group 331A, 331B or 331C have exactly the same storage capacity, and from this perspective, generally, all the HDDs are of the same model, made by the same manufacturer, and therefore all have the same power supply specifications and data transfer interfaces.

The power supply system of the storage system 320 comprises one or more AC/DC power supply circuit 329, and each AC/DC power supply circuit 329 inputs AC power from an external AC power supply 330 (for example, a commercial 200V AC power supply), converts this to a DC power of a prescribed voltage (for example, 56V, 48V, 24V, 12V, or the like), and then supplies the DC power to the plurality of HDD packs 333 and the other circuitry on the motherboard 328. The respective AC/DC power supply circuits 329 and the plurality of HDD packs 333 on the respective motherboards 328 are mutually connected by means of the power supply wiring pattern on each motherboard 328. In order to protect against interruption of the power supply, two (or more) sets of multiplexed AC power supplies 330 are used, in a mutually interchangeable fashion. The respective AC power supplies 330 are connected to the AC/DC power supply circuits 329, which are multiplexed in two or more layers, in a mutually interchangeable fashion. In the example illustrated, the respective AC/DC power supply circuits 329 are shared by the plurality of motherboards 328, but as a modification, it is also possible to provide one or more dedicated AC/DC power supply circuit for the exclusive use of each motherboard 328.

Figure 2:
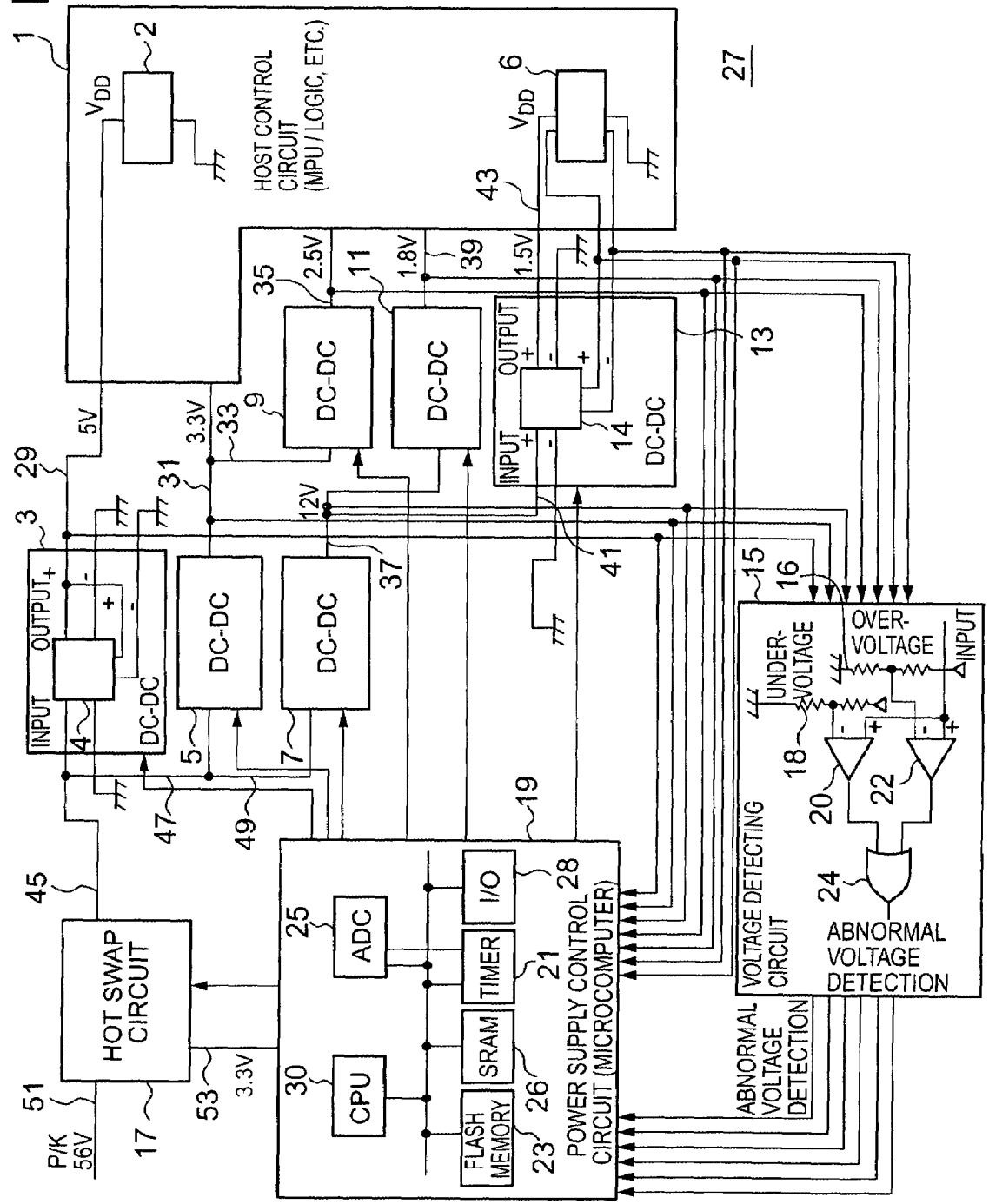
FIG. 2 is a block diagram showing the general composition of a power supply control system relating to a first embodiment of the present invention.

FIG. 2 is a block diagram showing the general composition of a power supply control system relating to a first embodiment of the present invention.

The aforementioned power supply control system is applied principally in order to control the drive voltage supplied from a power source to a load, such as a host control circuit (1) as described hereinafter, for example, and as illustrated in FIG. 2, this power supply control system is constituted by a host control circuit 1, a plurality of DC/DC converter modules (3, 5, 7, 9, 11, 13), a voltage detecting circuit 15, a hot-swap circuit 17, and a power supply control circuit 19, these elements being mounted on a circuit board 27.

The host control circuit 1 comprises, for example, a large-scaled integrated circuit (LSI) having a plurality of LSI chips (in FIG. 2, in order to simplify the illustration, only two LSI chips are depicted, respectively labeled with numerals 2 and 6), which function as micro processing units (MPU) or logical computing circuits, or the like. Each LSI chip is driven respectively by a drive voltage of a prescribed voltage. In the present embodiment, the host control circuit 1 has a plurality of LSI chips (5 LSI chips) which respectively have drive voltages of five different voltage values, for example, 5V, 3.3V, 2.5V, 1.8V and 1.5V. The LSI chip 2 is driven by a drive voltage of 5V that is supplied by the DC/DC converter module 3 via a power supply line 29, and the LSI chip 6 is driven by a drive voltage of 1.5V that is supplied by the DC/DC converter module 13 via a power supply line 43. Of the remaining drive voltages, the drive voltage of 3.3V is supplied from the DC/DC converter module 5 via the power supply line 31, the drive voltage of 2.5V is supplied from the DC/DC converter module 9 via the power supply line 35, and the drive voltage of 1.8V is supplied from the DC/DC converter module 11 via the power supply line 39, each of these drive voltages being applied respectively to the host control circuit 1.

As shown in FIG. 2, the DC/DC converter module 3 incorporates a built-in DC/DC converter circuit 4, and in the DC/DC converter circuit 4, the negative side input terminal, the negative side output terminal, and the negative side feedback signal input terminal are connected respectively to the earth of a port bypass circuit (PBC). The voltage signal output to the positive output terminal of the DC/DC converter circuit 4 is fed back to the DC/DC converter circuit 4, via a feedback signal transmission path, and the positive side feedback signal input terminal. Although not shown in the diagrams, the DC/DC converter modules 5 and 7 also have a similar internal composition to the DC/DC converter module 3, for example.

Similarly to the DC/DC converter module 3, the DC/DC converter module 13 also has a built-in DC/DC converter circuit 14, and in this DC/DC converter circuit 14 also, the negative side input terminal and the negative signal output terminal are connected respectively to an earth for a PBC. The positive side output terminal of the LSI chip 6, and the negative side output terminal of the LSI chip 6 are respectively connected, via a feedback signal transmission path, to the positive side feedback signal input terminal of the DC/DC converter circuit 14, and the negative side feedback signal input terminal of the DC/DC converter circuit 14.

The DC/DC converter module 3 is driven under the control of the power supply control circuit 19, and the voltage of 56V, for example, which is supplied from the power supply via the power supply line 51, the hot-swap circuit 17, and the power supply line 45, is reduced to 5V, and this 5V voltage is output to the host control circuit 1, via the power supply line 29, as described previously. Moreover, the DC/DC converter module 5 is also driven under the control of the power supply control circuit 19, and the voltage of 56V, for example, which is supplied via the power supply line 45 and the power supply line 47, is reduced to 3.3V, and this 3.3V voltage is output to the host control circuit 1, via the power supply line 31, in addition to which, it is also output to the DC/DC converter module 9, via the power supply line 31 and the power supply line 33. Moreover, the DC/DC converter module 7 is also driven under the control of the power supply control circuit 19, and the voltage of 56V, for example, which is supplied via the power supply line 45, the power supply line 47, and the power supply line 49, is reduced to 12V, and this 12V voltage is output to the DC/DC converter module 11 via the power supply line 37, in addition to which, it is also output to the DC/DC converter module 13, via the power supply line 37 and the power supply line 41.

The DC/DC converter module 9 is also driven under the control of the power supply control circuit 19, and the voltage of 3.3V, which is supplied via the power supply line 31 and the power supply line 33, is reduced to 2.5V, and this 2.5V voltage is output to the host control circuit 1, via the power supply line 35. The DC/DC converter module 11 is also driven under the control of the power supply control circuit 19, and the voltage of 12V, which is supplied via the power supply line 37, is reduced to 1.8V, and this 1.8V voltage is output to the host control circuit 1, via the power supply line 39. Furthermore, the DC/DC converter module 13 is also driven under the control of the power supply control circuit 19, and the voltage of 12V, which is supplied via the power supply line 37 and the power supply line 41, is reduced to 1.5V, and this 1.5V voltage is output to the host control circuit 1, via the power supply line 43.

The voltage signal output by each of the DC/DC converter modules (3–13) is output respectively to the A/D converter (hereinafter, abbreviated to "ADC") 25, and the voltage detecting circuit 15 which constitute the power supply control circuit 19.

The voltage detecting circuit 15 is provided in order to detect whether or not any of the voltage (signals) output by the respective DC/DC converter modules (3–13) is an abnormal voltage (in other words, an overvoltage or an undervoltage). As shown in FIG. 2, for example, the voltage detecting circuit 15 has a composition comprising, in at least a separate fashion for each of the DC/DC converter modules (3–13), an overvoltage judgment reference value output circuit 16, an undervoltage judgment reference value output circuit 18, an overvoltage judgment comparing circuit 22, an undervoltage judgment comparing circuit 20, and a logical sum circuit 24.

Here, for example, it is supposed that the respective sections described above correspond to the output voltage signal from the DC/DC converter module 3.

The overvoltage judgment comparing circuit 22 compares the output voltage signal from the DC/DC converter module 3 with the reference voltage from the overvoltage judgment reference value output circuit 16, and if the value of the output voltage signal exceeds this reference voltage, then it outputs a voltage signal with logic level "H". The undervoltage judgment comparing circuit 20, on the other hand, compares the output voltage signal with the reference voltage from the undervoltage judgment reference value output circuit 18, and if the value of the output voltage signal is less than this reference voltage, then it outputs a voltage signal with logic level "H". If the logic level of the voltage signal from either one of the overvoltage judgment comparing circuit 22 or the undervoltage judgment comparing circuit 20 is "H", then a voltage signal of logic level "H" indicating that an abnormal voltage has been detected (this signal being an interrupt signal as described hereinafter), is output to the power supply control circuit 19, from the logic sum circuit 24. Thereby, the power supply control circuit 19 determines that an error of any kind has occurred in the DC/DC converter module 3. The output voltage from the DC/DC converter module 13 is supplied to both the feedback signal transmission path on the positive side of the DC/DC converter circuit 14 described above, and the negative side feedback signal transmission path thereof.

The hot swap circuit 17 is provided in order to prevent a current flowing suddenly to the load side, in other words, the host control circuit 1, from the power supply side, via the respective power supply systems described above, and causing damage to the host control circuit 1 (namely, the respective LSI chips constituting same), when it is inserted onto the disk drive control device of the circuit board 27, or when it is removed from the disk drive control device of the circuit board 27, for example. The hot swap circuit 17 controls the rise and shutting off of the power supply in the circuit board 27, under the control of the power supply control circuit 19, whilst also causing the DC/DC converter modules (3–13) to operate in the correct sequence (in other words, the prescribed power supply sequence). Thereby, the current flows into the host control circuit 1, from the power supply side, in a gradual manner, via the respective power supply systems described above, and damage to the host control circuit 1 (namely, the respective LSI chips constituting same) is prevented. If the prescribed power supply sequence described above is not obeyed, then the host control circuit 1 (namely, the respective LSI chips comprising same) will be damaged.

The power supply control circuit 19 is a computing circuit, such as a microcomputer, for example, which incorporates a timer 21, a non-volatile memory (flash memory) 23, an ADC 25 with a built-in selector, an SRAM 26, an I/O register 28 and a CPU 30. The power supply control circuit 19 operates by taking the voltage of 3.3V, for example, output by the hot swap circuit 17 via the power supply line 53, as a drive voltage.

The ADC 25 is driven in synchronism with the clock signal from the timer 21, and it selects an output voltage signal from the respective DC/DC converter modules (3–13) by means of the aforementioned selector, samples the signal at a prescribed cycle frequency, and converts the signal from analogue to digital (converts it to binary data), which is then saved in the I/O register 28.

The CPU 30 is driven in synchronism with the clock signal from the timer 21, and it reads in the binary data output by the ADC 25, in a prescribed sequence, and writes this binary data, in the prescribed sequence, to the SRAM 26, for example. Here, the prescribed sequence means a sequence which is set, for example, in such a manner that the first position is taken the binary data relating to the output voltage signal from DC/DC converter module 3, the second position is taken by the binary data relating to the output voltage signal from DC/DC converter module 5, . . . , and the final position is taken by the binary data relating to the output voltage signal from DC/DC converter module 13. Since the time allocated to reading of the binary data by the ADC 25 at each sequence position is set to 1 μsec, for example, then when 1 μsec has elapsed, the ADC 25 starts to read in the binary data for the next position in the sequence.

In conjunction with this, the CPU 30 checks the output voltage signal from the voltage detecting circuit 15, in the same sequence as the reading sequence for the binary data from the ADC 25. As a result of this checking operation, if it is recognized that the voltage detecting circuit 15 has output a voltage signal of a prescribed logic level (for example, logic level "H"), (which indicates detection of an abnormal voltage), then the I/O register 28 outputs an interrupt signal of a prescribed logic level (in other words, a voltage signal of logic level "H" indicating that an abnormal voltage has been output by one of the DC/DC converter modules) to the CPU 30.

Under the control of the CPU 30, (binary) data of the amount required for data analysis (in other words, the output voltage signals of the respective DC/DC converter modules (3–13)) are stored in the SRAM 26, for a suitable number of cycles (time period), for example, data (output voltage signals) for n (=1000) sampling cycles, for instance. These (binary) data entries are updated with new (binary) data output from the ADC 25, via the CPU 30. Consequently, the latest data for the n cycles is always stored in the SRAM 26.

In addition to the aforementioned binary data supplied from the respective DC/DC converter modules (3–13) via the ADC 25, the voltage signal of a prescribed logic level (logic level "H") output by the voltage detecting circuit 15 (in order to indicate the detection of an abnormal voltage), is also stored in the SRAM 26.

If a voltage signal of a prescribed logic level (logic level "H") is output (in order to indicate that the voltage signal output by any one of the DC/DC converter modules (3–13) is abnormal) by the voltage detecting circuit 15, then that voltage signal, and the plurality of data (output voltage signals) held in the SRAM 26 at the time that voltage signal was output, are transferred from the SRAM 26 by the CPU 30, and stored in the non-volatile memory (flash memory) 23.

The data held in the SRAM 26 indicates the history of the variation in the output voltage signals which is required when analyzing the causes of an error, if an error has occurred in any one of the output voltage signals from the DC/DC converter modules (3–13), and the volume of this data is only that required in order to analyze the causes of the error, being set, for example, to n (=1000) cycles, as described previously. By transferring this data from the SRAM 26 to the non-volatile memory (flash memory) 23, it is possible to analyze the causes of an error, by means of the CPU 30, after the driving of the system has been halted.

As described above, the CPU 30 is driven in synchronism with the clock signal from the timer 21. The driving of the hot swap circuit 17, and the respective DC/DC converter modules (3–13) is controlled on the basis of the aforementioned binary data output by the ADC 25, and the interrupt signal of a prescribed logic level output by the voltage detecting circuit 15 (in other words, a voltage signal of logic level "H" indicating that an abnormal voltage has been output by one of the DC/DC converter modules (3–13)), and the like. If an interrupt signal, in other words, a voltage signal of a prescribed logic level (logic level "H") indicating that the voltage signal output by one of the DC/DC converter modules (3–13) is abnormal, is input from the voltage detecting circuit 15, then the CPU 30 halts the reading operation by the ADC 25 of the binary data for the voltage signals output by the DC/DC converter module (any one of 3–13) corresponding to the aforementioned interrupt signal.

In conjunction with this, the CPU 30 transfers the aforementioned binary data corresponding to the interrupt signal, as held in the SRAM 26 at the time that the reading of binary data by the ADC 25 is halted, to the non-volatile memory (flash memory) 23, and this binary data is stored in the non-volatile memory (flash memory) 23. When the CPU 30 has halted the driving of the system, the binary data of the volume (n(=1000) cycles) required for analyzing the causes of the aforementioned error is read out from the non-volatile memory (flash memory) 23, and the cause of the error is analyzed with respect to the DC/DC converter module (any one of 3–13) whose output voltage showed an abnormality.

The power supply control system illustrated in FIG. 2 is a control system for controlling the supply of power to the channel adapters 321, the disk adapters 322, the cache memories 323 and the shared memories 324 provided in the storage system 320 illustrated in FIG. 1.

Figure 3:
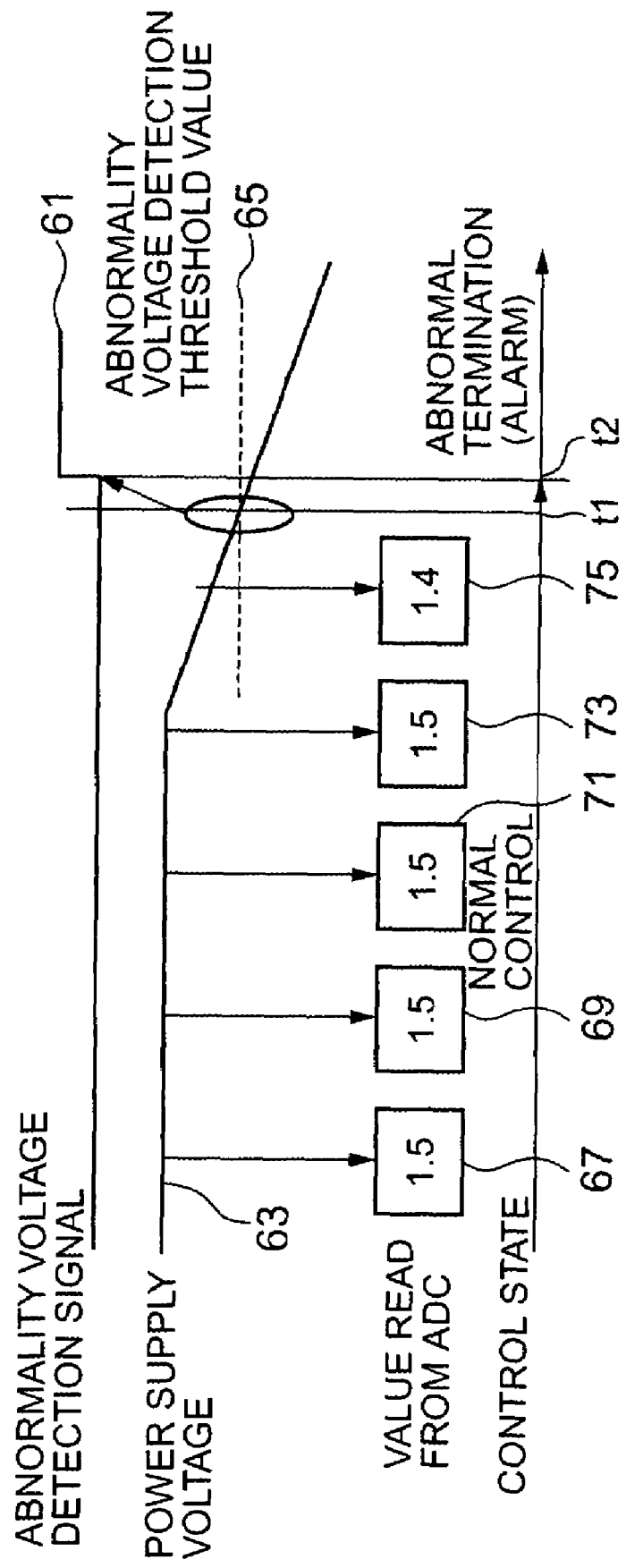
FIG. 3 is an illustrative diagram showing the state of a control operation by the power supply control circuit in the power supply control system shown in FIG. 2 in a case where the output voltage from one of the DC/DC converter modules is abnormal.
Figure 4:
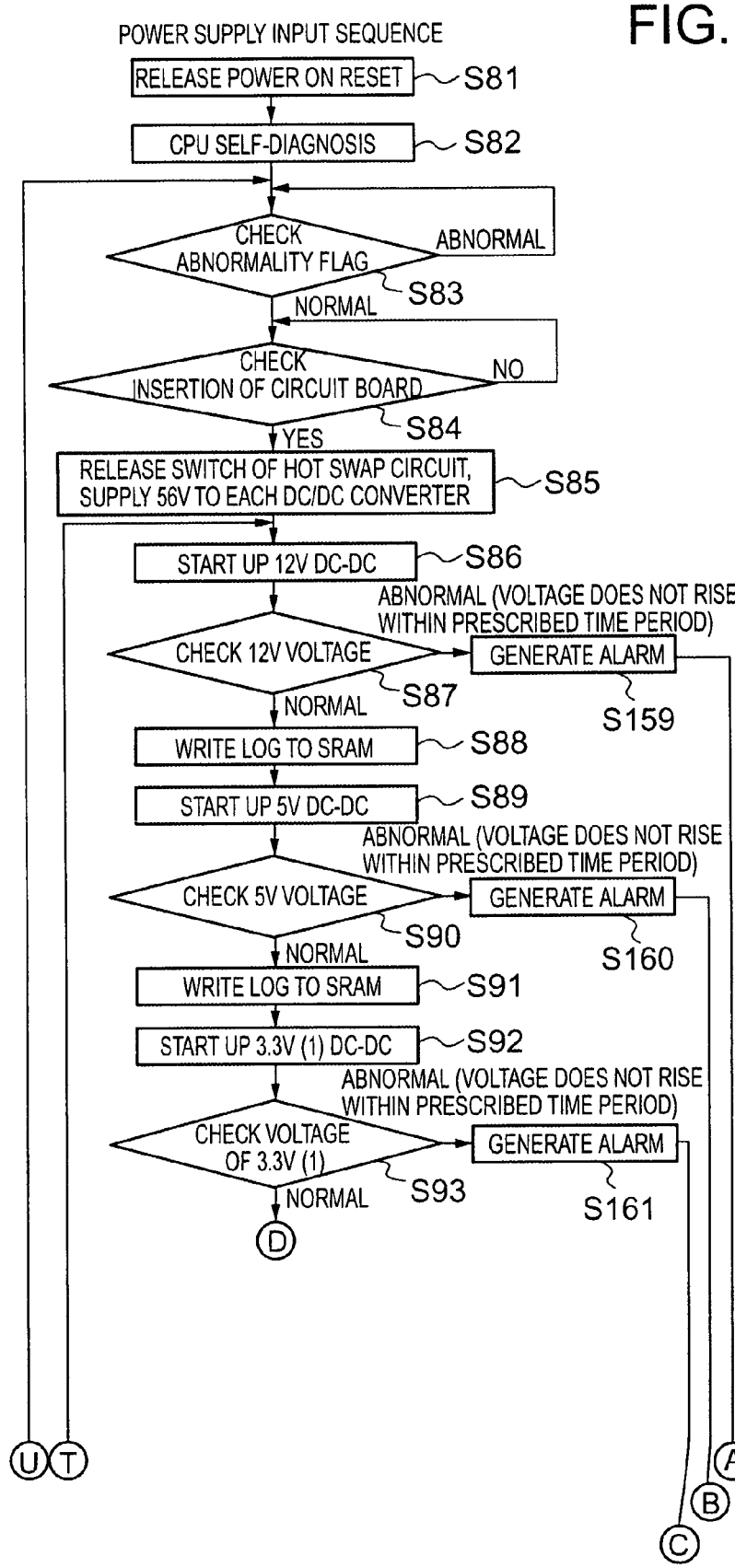
FIG. 4 is a flowchart showing the processing sequence of a control operation implemented by means of the power supply control circuit illustrated in FIG. 2.
Figure 5:
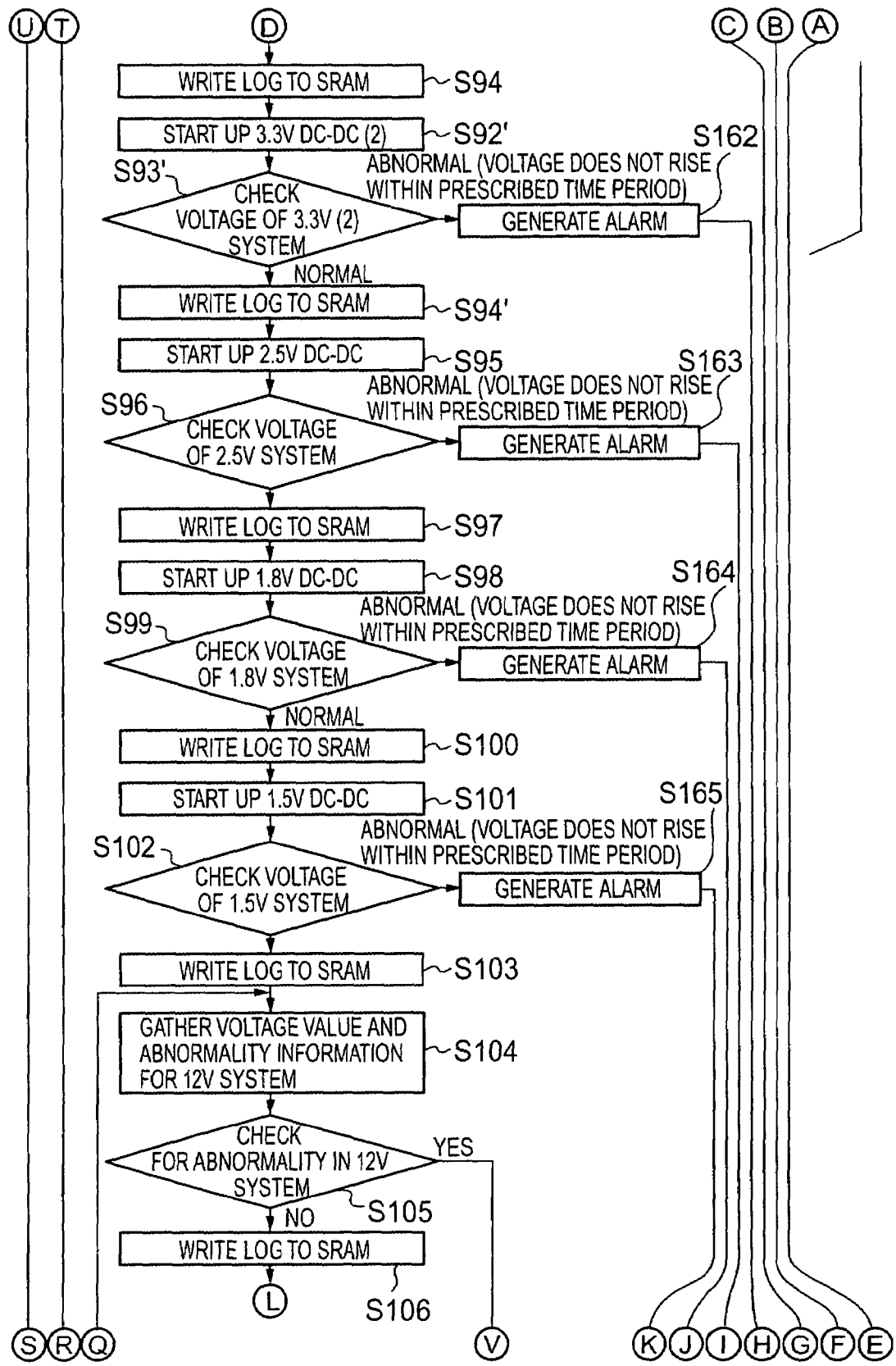
FIG. 5 is a flowchart showing the processing sequence of a control operation implemented by means of the power supply control circuit illustrated in FIG. 2.
Figure 6:
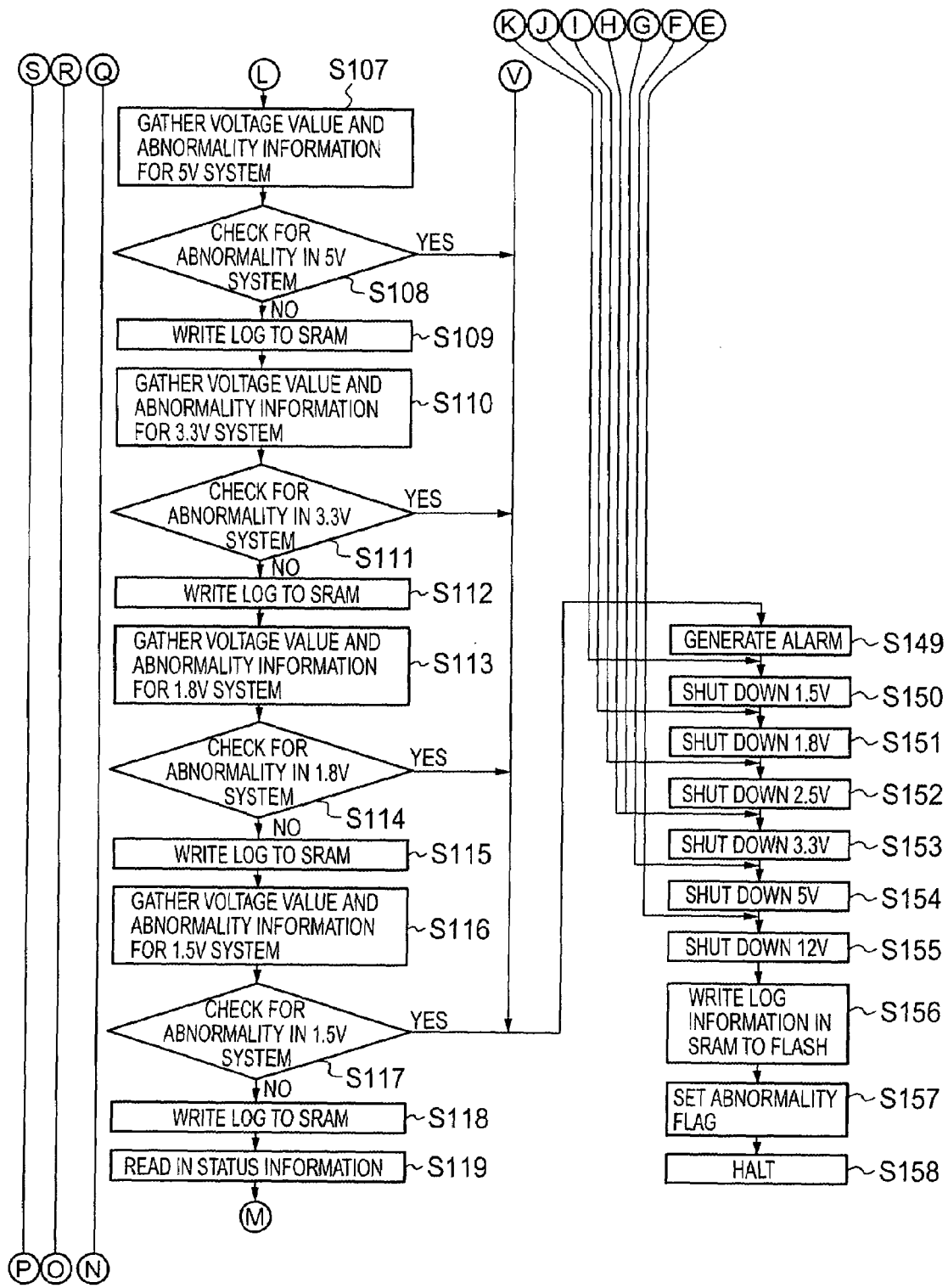
FIG. 6 is a flowchart showing the processing sequence of a control operation implemented by means of the power supply control circuit illustrated in FIG. 2.
Figure 7:
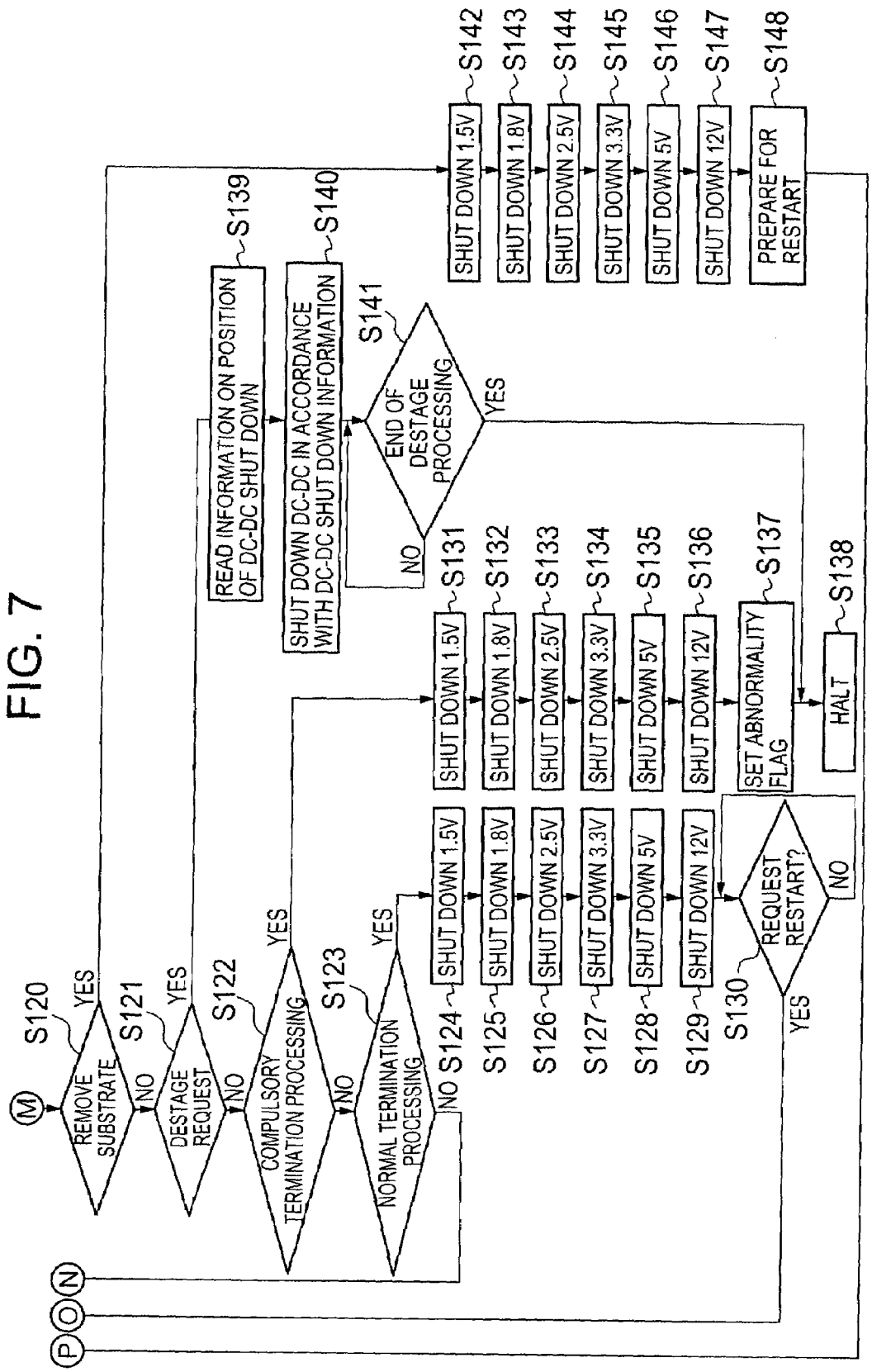
FIG. 7 is a flowchart showing the processing sequence of a control operation implemented by means of the power supply control circuit illustrated in FIG. 2.

FIG. 3 is an illustrative diagram showing the state of a control operation by the power supply control circuit 19 in the power supply control system shown in FIG. 2 in a case where the output voltage from one of the DC/DC converter modules (3–13) is abnormal.

In FIG. 3, the voltage value is shown on the vertical axis and the time is shown on the horizontal axis. Furthermore, numeral 61 denotes the output voltage level from the logic sum circuit (24) corresponding to DC/DC converter module 13 in the voltage detecting circuit 15 (as shown in FIG. 2), numeral 63 denotes the state of variation in the output voltage from the DC/DC converter module 13, and numeral 65 denotes the threshold value for determining whether or not the output voltage from the DC/DC converter module 13 is abnormal (in this case, the undervoltage judgment reference value data).

If the value of the binary data relating to the output voltage from the DC/DC converter module 13 output by the ADC 25 is 1.5V, as indicated respectively by numerals 67, 69, 71, 73, in other words, if the line 63 moves in parallel with respect to the horizontal axis, as time passes, then the output voltage from the DC/DC converter module 13 is normal. Therefore, in this case, the line 61, in other words, the logic level of the output voltage from the logic sum circuit (24) (shown in FIG. 2) corresponding to the DC/DC converter module 13 in the voltage detecting circuit 15, remains at level "L".

However, if, due to the occurrence of an error (fault) of any kind in the DC/DC converter module 13, the value of the binary data relating to the output voltage of the DC/DC converter module 13 output by the ADC 25 falls to 1.4V, as illustrated by numeral 75, and if it continues to fall and reaches the aforementioned threshold value (undervoltage judgment reference value data) or below by the time period $t_1$, then at time period $t_2$ which is slightly after time period $t_1$, a voltage signal of logic level "H" starts to be output by the voltage detecting circuit 15. Thereby, the power supply control circuit 19 halts the supply of power to the various parts of the system, and it reports to the host control circuit 1 shown in FIG. 2, for example, or the host circuit board (not illustrated) as described hereinafter, that it has halted driving of the system, due to the occurrence of an error.

FIG. 4, FIG. 5, FIG. 6 and FIG. 7 are flowcharts showing the processing sequence of a control operation performed by the power supply control circuit 19 illustrated in FIG. 2.

In FIG. 4 to FIG. 7, firstly, when the driving power supply to the system is switched on, the reset state of the system is cancelled, the system is started up (step S81), and the power supply control circuit 19 then carries out automatic diagnosis (step S82). More specifically, it checks whether the error flag in the power supply control circuit 19 is "1" or "0" (step S83), and if as a result of this check, the error flag is "0" (normal at step S83), then it checks whether or not the circuit board 27 shown in FIG. 2 has been inserted into a disk drive control device (step S84). If, as a result of this check, it is confirmed that the circuit board 27 has been inserted into a disk drive control device (YES at step S84), then the hot swap circuit 17 is started up, and DC power at 56V starts to be supplied respectively to the DC/DC converter modules (3, 5, 7) (step S85).

If, as a result of the aforementioned check, the error flag is "1", (abnormal at step S83), then the sequence does not advance to the processing operations from step S84 onwards. Moreover, the same applies if it cannot be confirmed that the circuit board 27 has been inserted into a disk drive control device (NO at step S84).

Next, the DC/DC converter module 7, which is a 12V DC/DC converter module, is started up (step S86), and it is checked whether or not the output voltage from the DC/DC converter module 7 is normal (step S87). If, as a result of this check, the output voltage is normal (normal at step S87), then the binary data for the output voltage value is written to the SRAM 26 in the power supply control circuit 19 (step S88). Next, the DC/DC converter module 3, which is a 5V DC/DC converter module, is started up (step S89), and it is checked whether or not the output voltage from the DC/DC converter module 3 is normal (step S90). If, as a result of this check, the output voltage is normal (normal at step S90), then the binary data for the output voltage value is written to the SRAM 26 (step S91). Next, the DC/DC converter module 5, which is a 3.3V DC/DC converter module, is started up (step S92), and it is checked whether or not the output voltage from the DC/DC converter module 5 is normal (step S93). If, as a result of this check, the output voltage is normal (normal at step S93), then the binary data for the output voltage value is written to the SRAM 26 (step S94).

Here, if a further 3.3V DC/DC converter module (not illustrated) is connected in parallel in addition to the DC/DC converter module indicated by numeral 5, then processing operations similar to those in step S92 to step S94 are carried out with respect to this separate DC/DC converter module (not illustrated), in step S92' to step S94'. The reason for this is that the 3.3V type DC/DC converter module has many output currents, and therefore the variation in the output current is reduced by controlling the respective DC/DC converter modules, independently.

Next, the DC/DC converter module 9, which is a 2.5V DC/DC converter module, is started up (step S95), and it is checked whether or not the output voltage from the DC/DC converter module 9 is normal (step S96). If, as a result of this check, the output voltage is normal (normal at step S96), then the binary data for the output voltage value is written to the SRAM 26 (step S97). Next, the DC/DC converter module 11, which is a 1.8V DC/DC converter module, is started up (step S98), and it is checked whether or not the output voltage from the DC/DC converter module 11 is normal (step S99). If, as a result of this check, the output voltage is normal (normal at step S99), then the binary data for the output voltage value is written to the SRAM 26 (step S100). Next, the DC/DC converter module 13, which is a 1.5V DC/DC converter module, is started up (step S101), and it is checked whether or not the output voltage from the DC/DC converter module 13 is normal (step S102). If, as a result of this check, the output voltage is normal (normal at step S102), then the binary data for the output voltage value is written to the SRAM 26 (step S103).

Thereupon, the output voltage from the 12V DC/DC converter module 7 is read in via the ADC 25, and a voltage signal relating to the DC/DC converter module 7 and output by the voltage detecting circuit 15 is also read in (step S104). It is then checked whether or not a voltage signal of a prescribed logic level indicating an abnormal voltage has been output by the voltage detecting circuit 15 (step S105). If, as a result of this check, the output voltage of DC/DC converter module 7 is normal (NO at step S105), then the binary data for the output voltage value is written to the SRAM 26 (step S106). Thereupon, the output voltage from the 5V DC/DC converter module 3 is read in via the ADC 25, and a voltage signal relating to the DC/DC converter module 3 as output by the voltage detecting circuit 15 is also read in (step S107). It is then checked whether or not a voltage signal of a prescribed logic level indicating an abnormal voltage has been output by the voltage detecting circuit 15 (step S108). If, as a result of this check, the output voltage of DC/DC converter module 3 is normal (NO at step S108), then the binary data for the output voltage value is written to the SRAM 26 (step S109).

Thereupon, the output voltage from the 3.3V DC/DC converter module 5 is read in via the ADC 25, and a voltage signal relating to the DC/DC converter module 5 as output by the voltage detecting circuit 15 is also read in (step S110). It is then checked whether or not a voltage signal of a prescribed logic level indicating an abnormal voltage has been output by the voltage detecting circuit 15 (step S111). If, as a result of this check, the output voltage of DC/DC converter module 5 is normal (NO at step S111), then the binary data for the output voltage value is written to the SRAM 26 (step S112). Thereupon, the output voltage from the 1.8V DC/DC converter module 11 is read in via the ADC 25, and a voltage signal relating to the DC/DC converter module 11 as output by the voltage detecting circuit 15 is also read in (step S113). It is then checked whether or not a voltage signal of a prescribed logic level indicating an abnormal voltage has been output by the voltage detecting circuit 15 (step S114). If, as a result of this check, the output voltage of DC/DC converter module 11 is normal (NO at step S114), then the binary data for the output voltage value is written to the SRAM 26 (step S115). Thereupon, the output voltage from the 1.5V DC/DC converter module 13 is read in via the ADC 25, and a voltage signal relating to the DC/DC converter module 13 as output by the voltage detecting circuit 15 is also read in (step S116). It is then checked whether or not a voltage signal of a prescribed logic level indicating an abnormal voltage has been output by the voltage detecting circuit 15 (step S117). If, as a result of this check, the output voltage of the DC/DC converter module 13 is normal (NO at step S117), then the binary data for the output voltage value is written to the SRAM 26 (step S118), whereupon the status information indicating the state of the whole system is read in from the SRAM 26, for example (step S119). Respective checks are then made to determine whether or not the circuit board 27 has been removed from the disk drive control device (step S120), whether or not a destage request has been made (step S121), whether or not a compulsorily termination instruction has been issued (step S122), and whether or not a normal termination instruction has been issued (step S123).

If, as a result of these checks, the circuit board 27 is still inserted into the disk drive control device (NO at step S120), if no destage request has been made (NO at step S121), if no compulsory termination instruction has been issued (NO at step S122), and furthermore, if no normal termination instruction has been issued (NO at step S123), then the sequence returns to the processing indicating in step S104. As a result of the foregoing checks, various checks are made with respect to step 123.

Moreover, if, as a result of the aforementioned checks, the response is NO in all of the steps S120 to S122, but a normal termination instruction has been issued (YES at step S123), then firstly, the output from the DC/DC converter module 13 is shut off (step S124), whereupon the output from the DC/DC converter module 11 is shut off (step S125). Thereupon, the output from the DC/DC converter module 9 is shut off (step S126), the output from the DC/DC converter module 5 is then shut off (step S127), the output from the DC/DC converter module 3 is then shut off (step S128), and finally the output from the DC/DC converter module 7 is shut off (step S129). If it is confirmed that a request to restart the system has been made (YES at step S130), then the sequence returns to the processing indicated in step S86.

Furthermore, if, as a result of the aforementioned checks, the response is NO in all of the steps S120 to S121, but a compulsory termination instruction has been issued (YES at step S122), then firstly, the output from the DC/DC converter module 13 is shut off (step S131), whereupon the output from the DC/DC converter module 11 is shut off (step S132). Thereupon, the output from the DC/DC converter module 9 is shut off (step S133), the output from the DC/DC converter module 5 is then shut off (step S134), the output from the DC/DC converter module 3 is then shut off (step S135), and finally the output from the DC/DC converter module 7 is shut off (step S136). After setting the aforementioned error flag (step S137), the sequence of processing operations is halted (step S138).

Moreover, if, as a result of the aforementioned checks, the response is NO at step S120, but a request for destage has been made (YES at step S121), then information indicating which of the DC/DC converter modules should shut off the supply of power to the host control circuit 1 is read in from the SRAM 26 (step S319), and the driving of the DC/DC converter module which is to shut off power supply is halted, on the basis of the information thus read in (step S140). When the completion of the test has been confirmed (YES at step S141), the sequence shifts to step S138 (halts the sequence of processing operations).

Furthermore, if, as a result of the aforementioned checks, it is confirmed that the circuit board 27 has been removed from the disk drive control device (YES at step S120), then firstly, the output from the DC/DC converter module 13 is shut off (step S142), whereupon the output from the DC/DC converter module 11 is shut off (step S143). Thereupon, the output from the DC/DC converter module 9 is shut off (step S144), the output from the DC/DC converter module 5 is then shut off (step S145), the output from the DC/DC converter module 3 is then shut off (step S146), and finally the output from the DC/DC converter module 7 is shut off (step S147). When preparations for restarting the system have been completed (step S148), then the sequence returns to the processing indicated in step S83.

Thereupon, if it is confirmed, as a result of the check at step S117, that the output voltage of the DC/DC converter module 13 is abnormal, then a prescribed warning (alarm) is generated (step S149), and furthermore, firstly, the output from the DC/DC converter module 13 is shut off (step S150), and then the output from the DC/DC converter module 11 is shut off (step S151). Thereupon, the output from the DC/DC converter module 9 is shut off (step S152), the output from the DC/DC converter module is then shut off (step S153), the output from the DC/DC converter module 3 is then shut off (step S154), and finally the output from the DC/DC converter module 7 is shut off (step S155). The binary data relating to the output voltages from the respective DC/DC converter modules (3–13) written to the SRAM 26, and the data relating to the abnormal voltage in the case that an abnormal voltage is detected by the voltage detecting circuit 15, and the like, is written to the non-volatile memory 23 (step S156), the aforementioned error flag is set (step S157), and the sequence of processing operations is halted (step S158).

Thereupon, if, as a result of checking the output voltage from the DC/DC converter module 7, which is a 12V type DC/DC converter module, the output voltage is abnormal (for example, it does not rise within a prescribed time period), (abnormal at step S87), then the prescribed warning (alarm) is generated (step S159), and furthermore, the sequence advances to the processing indicated in step S155. Furthermore, if, as a result of checking the output voltage from the DC/DC converter module 3, which is a 5V DC/DC converter module, the output voltage is abnormal (abnormal at step S90), then the prescribed alarm is generated (step S160), and the sequence advances to the processing shown in step S154. Furthermore, if, as a result of checking the output voltage from the DC/DC converter module 5, which is a 3.3V type DC/DC converter module, the output voltage is abnormal (for example, it does not rise within a prescribed time period), (abnormal at step S93), then the prescribed warning (alarm) is generated (step S161), and furthermore, the sequence advances to the processing indicated in step S153. Furthermore, if, as a result of checking the output voltage from a further, separate DC/DC converter module (not illustrated) which is a similar 3.3V type DC/DC converter module, the output voltage is abnormal, (abnormal at step S93'), then the prescribed alarm is generated (step S162), and the sequence advances to the processing in step S153. Furthermore, if, as a result of checking the output voltage from the DC/DC converter module 9, which is a 2.5V DC/DC converter module, the output voltage is abnormal (abnormal at step S96), then the prescribed alarm is generated (step S163), and the sequence then advances to the processing indicated in step S152. Furthermore, if, as a result of checking the output voltage from the DC/DC converter module 11, which is a 1.8V DC/DC converter module, the output voltage is abnormal (abnormal at step S99), then the prescribed alarm is generated (step S164), and the sequence then advances to the processing indicated in step S151. Furthermore, if, as a result of checking the output voltage from the DC/DC converter module 13, which is a 1.5V DC/DC converter module, the output voltage is abnormal (abnormal at step S102), then the prescribed alarm is generated (step S165), and the sequence then advances to the processing indicated in step S150.

Moreover, if, as a result of checking the output voltage from the DC/DC converter module 7, which is a 12V type DC/DC converter module, the output voltage of the DC/DC converter module 7 is abnormal (YES at step S105), then the sequence advances to the processing illustrated in step S149. The same applies if the response is YES at step S108, step S111 or step S114.

Below, the DC/DC converter modules are referred to as "DC/DC converters" for the sake of the description.

Figure 8:
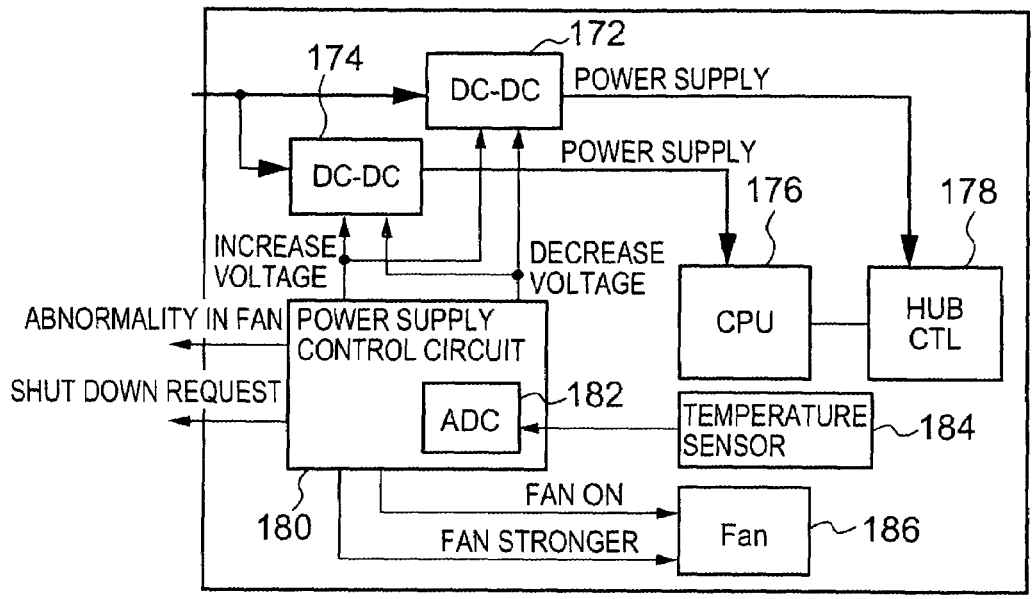
FIG. 8 is a block diagram showing the principal parts of a disk adapter using the power supply control system illustrated in FIG. 2.

FIG. 8 is a block diagram showing the principal parts of a disk adapter using the power supply control system illustrated in FIG. 2.

The disk adapter shown in FIG. 8 comprises a power supply control system having DC/DC converters 172, 174 and a power supply control circuit 180 with built-in ADC 182, and furthermore it also comprises a hub controller (HUB-CTL) 178, a CPU 176, a temperature sensor 184 for detecting the temperature in the CPU 176 and the disk adapter in the vicinity of same, and a fan 186 for cooling the interior of the disk adapter. In the power supply control system illustrated in FIG. 7, the voltage detecting circuit 15 shown in FIG. 2, the hot swap circuit 17, the timer 21 in the power supply control circuit 19, the non-volatile memory 23, and the remaining plurality of DC/DC converters are not illustrated, in order to facilitate the description.

Under the control of the power supply control circuit 180, the DC/DC converter 172 receives a power supply from the commercial power source, and supplies DC power at the prescribed voltage, to the hub controller 178. Similarly to the DC/DC converter 172, under the control of the power supply control circuit 180, the DC/DC converter 174 receives a power supply from the commercial power source, and supplies DC power at the prescribed voltage, to the CPU 176.

The power supply control circuit 180 controls the voltage of the DC power supplied to the hub controller 178, via the DC/DC converter 172, on the basis of the temperature detection data from the temperature sensor 184 which is read in via the ADC 182. The power supply control circuit 180 also controls the voltage of the DC power supplied to the CPU 176 via the DC/DC converter 174, on the basis of the aforementioned temperature detection data. The power supply control circuit 180 also controls the on/off switching of the fan 186, on the basis of the aforementioned temperature detection data, as well as controlling the rotational speed of the fan 186. If it is judged that any error has occurred in the fan 186, on the basis of the aforementioned temperature detection data, the power supply control circuit 180 reports the fact that there is an error in the fan 186, to the host control circuit, which is realized by a MPU or logical computing circuit, for example, or alternatively, if it is judged that the driving of the disk adapter is to be halted (shut down), then the power supply control circuit 180 reports the fact that the driving of the disk adapter is to be halted, to he host control circuit, for example.

Figure 9:
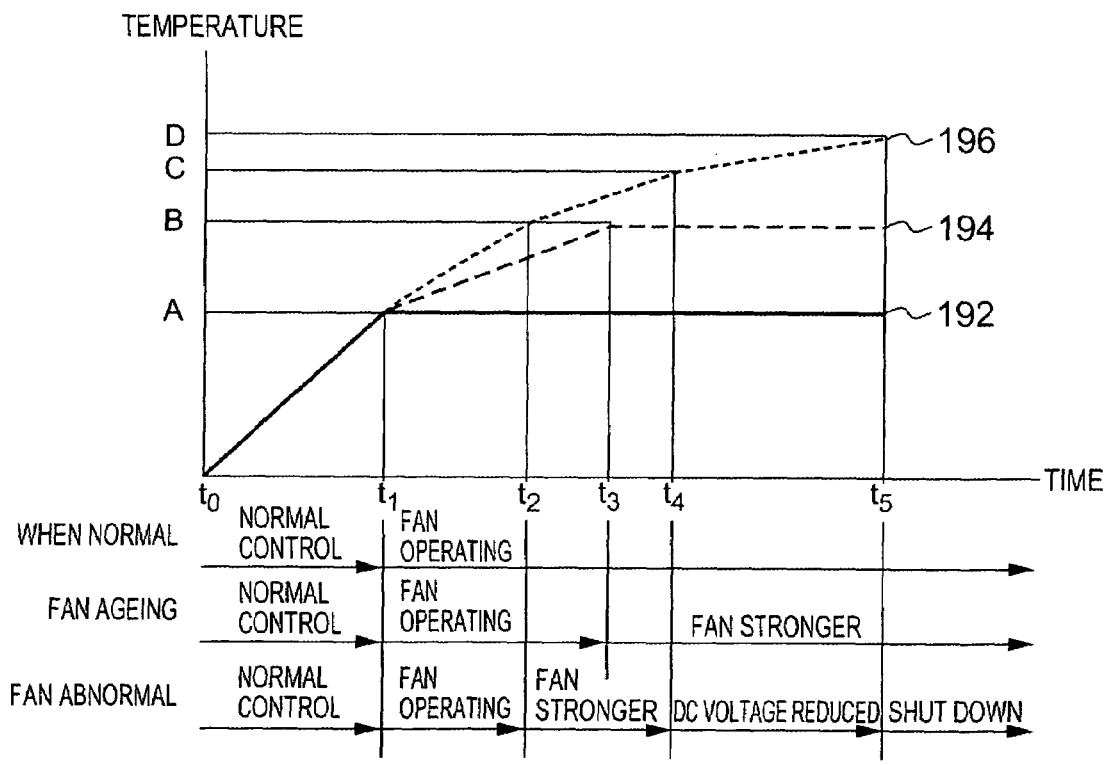
FIG. 9 is a timing chart showing the relationship between the control operations of the power supply control circuit illustrated in FIG. 8 with respect to the fan, and the DC/DC converters, and the temperature detection value detected by the temperature sensor.

FIG. 9 is a timing chart showing the relationship between the control operations of the power supply control circuit 180 illustrated in FIG. 8 with respect to the fan 186, and the DC/DC converters 172, 174, and the temperature detection value detected by the temperature sensor 184.

In FIG. 9, the solid line 192 indicates the transition of the temperature detection value output by the temperature sensor 184 in a case where the fan 186 is new, there is no problem, such as a fault or error, or the like, in the fan 186, and hence the fan 186 has a normal cooling capability. Next, the broken line 194 indicates the transition of the temperature detection value output by the temperature sensor 184 in a case where, although there is no problem, such as a noticeable fault, or the like, in the fan 186, the cooling capability of the fan 186 has declined slightly, due to ageing of the fan 186. Furthermore, the broken line 196 indicates the transition of the temperature detection value output by the temperature sensor 184 in a case where a noticeable problems, such as a fault, error, or the like, has occurred in the fan 186, and hence the cooling capability of the fan 186 has declined dramatically.

If the drive power to the disk adapter is switched on at time $t_0$, the value of the temperature detection signal output by the temperature sensor 184 increases in an approximately linear fashion, as time passes. When the temperature detection value reaches a previously set temperature threshold value A for activation of the fan, at time $t_1$, then the power supply control circuit 180 starts up the fan 186. Here, if the fan 186 is normal (in other words, if the cooling capability of the fan 186 is normal and has not declined), then the temperature detection value will remain around the value A, as indicated by the solid line 192, due to the continuous driving of the fan 186 at a prescribed rotational speed (continuous uniform operation). However, if the fan 186 has aged, then even if the fan 186 is operated continuous at a uniform speed, since the actual cooling capability of the fan 186 has declined slightly, then the temperature detection value will not change as indicated by the solid line 192, but rather, as indicated by the broken line 194, it will rise continuously, albeit at a slightly shallower gradient than the gradient between time $t_0$ and $t_1$. When the temperature detection value reaches a previously set temperature threshold value B for increasing the rotational speed of the fan, at time $t_3$, (a value of approximately 80–90% of the maximum temperature envisaged in the design specifications of the disk adapter), then the power supply control circuit 180 executes control in order to increase the rotational speed of the fan 186 to a prescribed number of revolutions. Accordingly, from time $t_3$ onwards, the temperature detection value changes to around value B, as indicated by the broken line 194.

Furthermore, if the cooling capability of the fan 186 has declined markedly, due to a noticeable problem, such as a fault, error, or the like, in the fan 186, then even if the fan 186 starts up at time $t_1$, the temperature detection value will rise continuously at a gradient slightly lower than the temperature gradient between time $t_0$ and time $t_1$, as shown by the broken line 196. Therefore, if the temperature detection value reaches the aforementioned temperature threshold value B for increasing the rotational speed of the fan, at time $t_2$, which is between time $t_1$ and time $t_3$, then the power supply control circuit 180 executes control for increasing the rotational speed of the fan 186 to a prescribed number of revolutions. However, even if the rotational speed of the fan 186 is increased at time $t_2$, the temperature detection value will continue to rise in accordance with a gradient approximately the same as the gradient between time $t_1$ and time $t_2$, and at time $t_4$, the temperature will reach the temperature threshold value C for reducing the output voltage of the DC/DC converter (172, 174) (the maximum temperature envisaged in the design specifications of the disk adapter). If it is confirmed that the temperature detection value has reaches the aforementioned temperature threshold value C, then the power supply control circuit 180 causes the voltage of the drive power supplied to the load to be reduced (to the minimum voltage value required for normal operation of the load), by controlling the DC/DC converters (172, 174).

However, even if control is implemented at time $t_4$ in order to reduce the drive voltage supplied to the load, but the temperature detection value still continues to rise, and at time $t_5$, the temperature detection value reaches a temperature threshold value D for halting driving of the disk adapter, then the power supply control circuit 180 waits for an instruction from the aforementioned host control circuit, for example, and executes processing for halting (shutting down) the drive of the disk adapter.

By implementing the control described above, even if a problem, such as a fault, or the like, has occurred in the fan 186, it is still possible to continue driving the disk adapter, until the temperature detection value in the CPU 176 or the vicinity thereof reaches a temperature threshold value for shutting down the disk adapter.

The details described in FIG. 8 and FIG. 9 relate to an example where the power supply control system illustrated in FIG. 2 is applied to a disk adapter, but the power supply control system illustrated in FIG. 2 may of course also be applied to a device other than a disk adapter.

Figure 10:
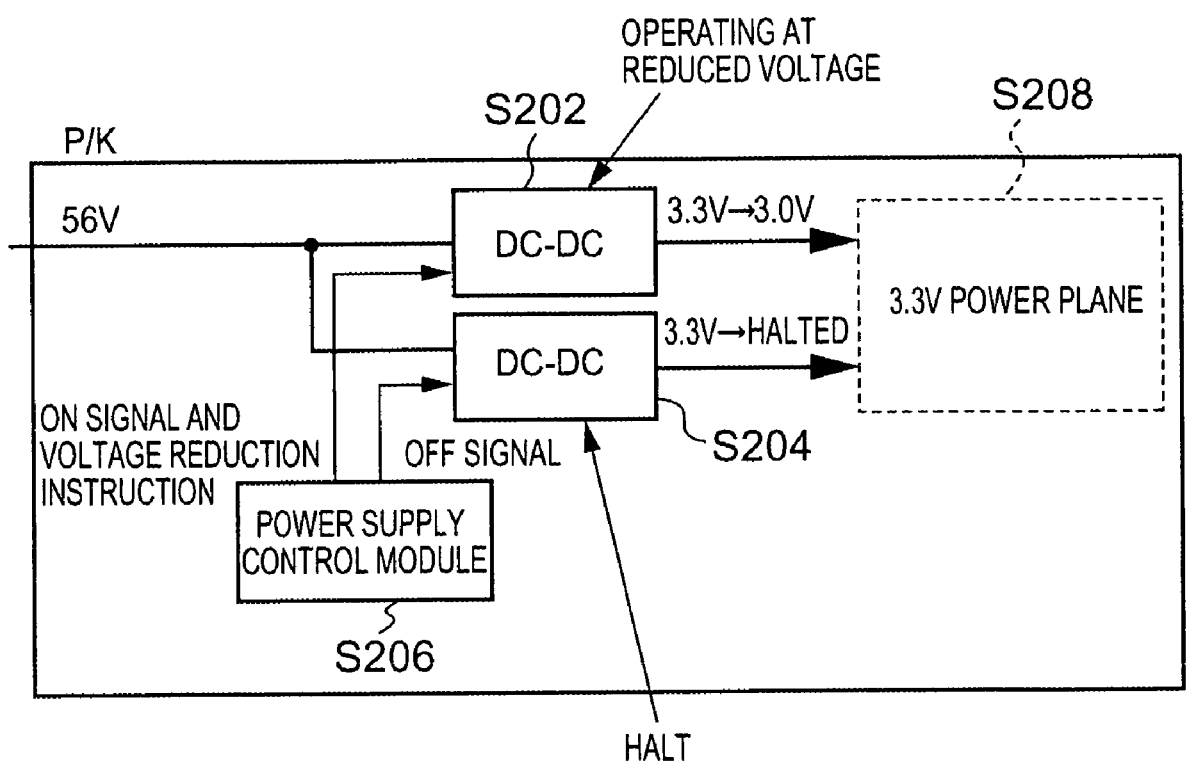
FIG. 10 is a block diagram showing the principal parts of a modification of the disk adapter illustrated in FIG. 8.

FIG. 10 is a block diagram showing the principal parts of a modification of the disk adapter illustrated in FIG. 8.

The disk adapter shown in FIG. 10 is provided with DC/DC converters 202, 204, a power supply control module 206 for controlling the driving of the DC/DC converters 202, 204, and a 3.3V power supply plane.

In FIG. 10, the DC/DC converter 202 and the DC/DC converter 204 are both controlled respectively by the power supply control module 206, and they receive 56V DC power supplied by an DC/DC converter (not illustrated) connected to a commercial power source, and they are connected to the 3.3V power supply plane 208 in such a manner that a DC power stepped down to 3.3V can be supplied to the 3.3V power supply plane 208 by either one of the DC/DC converters (202, 204), thus providing redundancy to the 3.3V power supply plane 208. In the foregoing composition, when the commercial power source is interrupted, if destage processing is being carried out in order to write the data stored temporarily in the cache memory which forms a storage control device, together with the disk adapter, and the like, to a storage device (hard disk, or the like), via the disk adapter, then the power supply control module 206 performs the following power-saving control in the DC/DC converters 202, 204, in order to extend the life of the back-up power supply, such as a nickel hydrogen battery, or the like.

In other words, in the aforementioned destage process, the power supply control module 206 controls the DC/DC converters 202, 204 in such a manner that, if power is being supplied to the 3.3V power supply plane 203 from the nickel hydrogen battery, by means of the DC/DC converter 202, then it halts the driving of the DC/DC converter 204, and if power is being supplied to the 3.3V power supply plane 203 from the nickel hydrogen battery, by means of the DC/DC converter 204, then it halts the driving of the DC/DC converter 202. Moreover, in the destage processing, according to requirements the power supply control module 206 also executes control for reducing the output voltage of one of the DC/DC converters 202, from 3.3V, to the minimum voltage required for operating the device which is the load, for example 3V.

Figure 11:
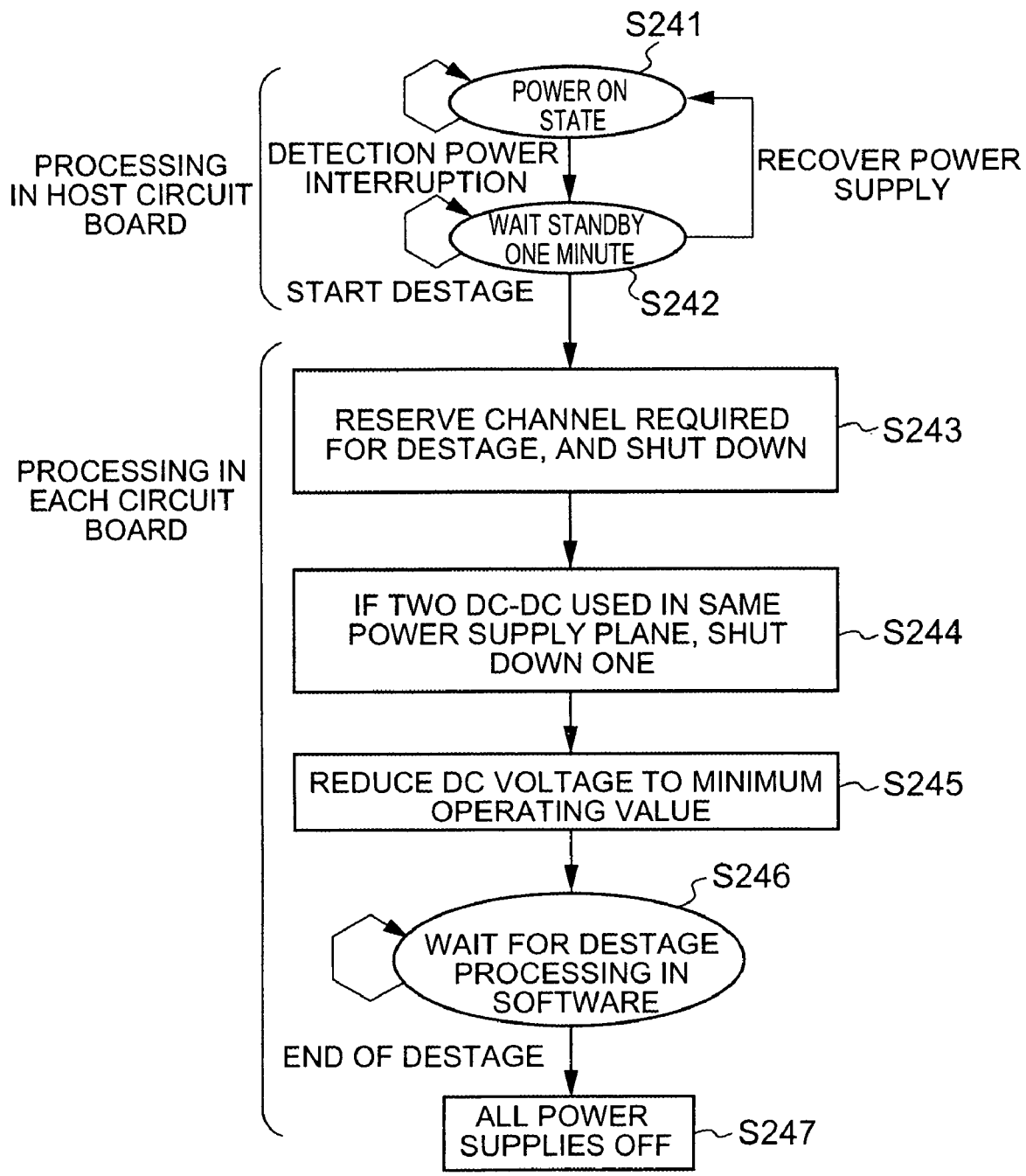
FIG. 11 is a flowchart showing a processing sequence in the host circuit board during destage processing, and the control sequence implemented by the power supply control module illustrated in FIG. 10, with respect to the DC/DC converters.

FIG. 11 is a flowchart showing a processing sequence in the host circuit board during destage processing, and the control sequence implemented by the power supply control module 206 illustrated in FIG. 10, with respect to the DC/DC converters 202, 204.

In FIG. 11, in the processing performed by the host circuit board, which is situated above the circuit board in which the various devices illustrated in FIG. 10 are mounted, firstly, a check is made to see whether or not the commercial power source is normal (step S241), and if a power interruption is detected as a result of this check, then the process waits at standby for one minute. If the commercial power source does not revert to a normal state from the interrupted state within one minute, then upon notification from the host circuit board, destage processing is started in the respective circuit boards containing the disk adapter illustrated in FIG. 10. More specifically, a channel required or destage processing is reserved, and all of the remaining channels are shut down, thereby seeking to extend the life of the nickel hydrogen battery forming the back-up power supply (step S243), and consequently, if two DC/DC converters are being driven in the same power supply plane, then one of these is shut down (in the example shown in FIG. 10, the driving of the DC/DC converter 204 is halted) (step S244).

Next, the output voltage (DC voltage) of the remaining DC/DC converter is reduced to the minimum operating voltage for the corresponding device (in the example shown in FIG. 10, the output voltage of the DC/DC converter 202 is reduced from 3.3V to 3V (step S245). When the end of destage processing is confirmed (step S246), the channel required for the destage process is also shut town (step S247), whereupon the sequence of processing operations is terminated.

Figure 12:
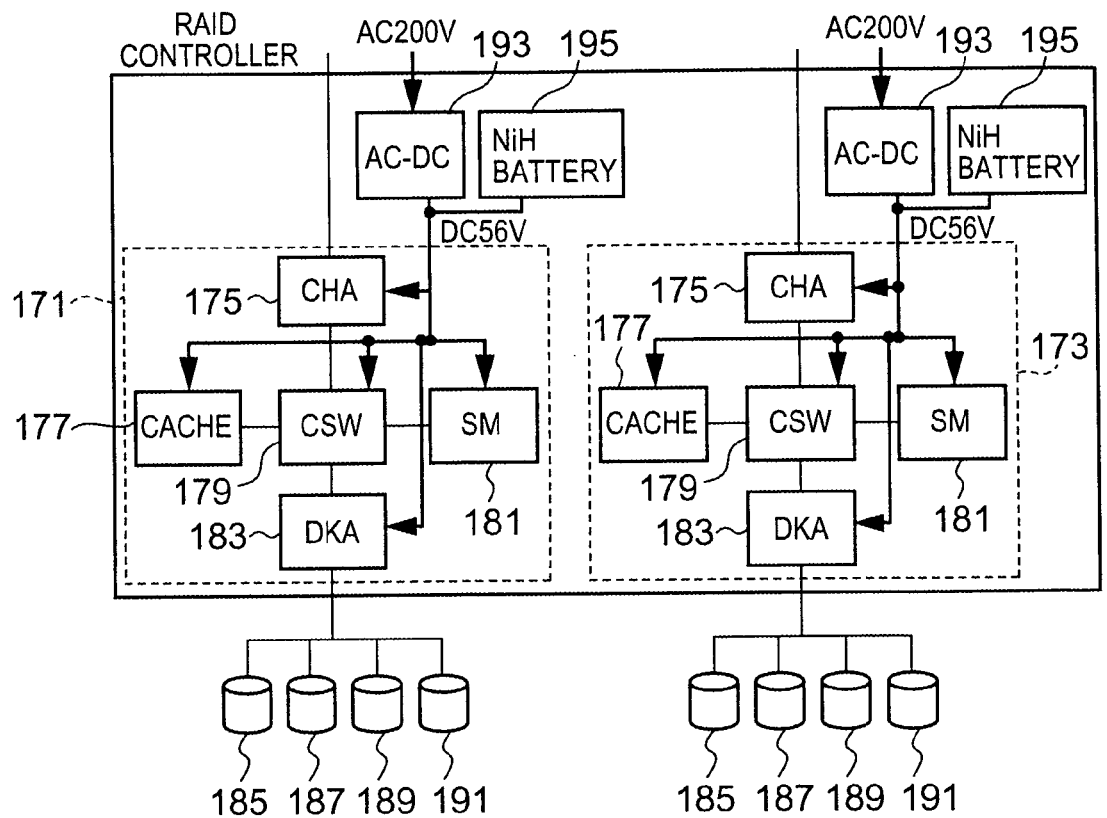
FIG. 12 is a block diagram showing the general composition of a storage system relating to a second embodiment of the present invention.

FIG. 12 is a block diagram showing the general composition of a storage system relating to a second embodiment of the present invention. As shown in FIG. 12, this storage system comprises two storage control devices, 171, 173 having the same internal composition.

In FIG. 12, the storage control device 171 comprises a plurality of channel adapters (CHA) (only the CHA labeled 175 is illustrated in FIG. 12), a cache memory (CACHE) 177, a switching control section (CSW) 179, a shared memory (SM) 181, a plurality of disk adapters (DKA) (only the DKA labeled 183 is illustrated in FIG. 12), and a plurality of storage devices 185, 187, 189, 191. If the commercial power source (AC 200V) is in a normal state, then DC power at the prescribed voltage (for example, 56V) is supplied respectively as a drive voltage, to each of the aforementioned sections, by the AC/DC converter 193. However, if the commercial power source (AC 200V) has been interrupted, then drive power is only supplied from the back-up power supply 195, such as the nickel hydrogen battery (dry cell), or the like, to those sections required in order to withdraw the data held temporarily in the write cache of the cache memory 177, described hereinafter, and the write cache address and read cache address, and the like, held in the shared memory 181, by transferring it to any one of the storage devices 185–191.

The channel adapter 175 functions as a host interface for performing data communications with the host device (host computer) (not illustrated), and it comprises a communications port for communicating with the host device (not illustrated), and a microcomputer. The channel adapter 175 writes data received from the host device (not illustrated) to the write cache of the cache memory 177, which is described hereinafter, and it also reads out data written to the read cache of the cache memory 177, described hereinafter, from any one of the storage devices 185–191, by means of the disk adapter 183, and transfers this data to the host device (not illustrated).

When it is confirmed that the commercial power source (AC 200V) is in an interrupted state, on the basis of a notification from the AC/DC converter 193, then if processing is currently being executed on the basis of an instruction from the host device (not illustrated) (for example, a processing for writing data transferred form the host device (not illustrated) to the storage devices 185–191, or the like), the channel adapter 175 reports to the host device (not illustrated) that this processing will not be completed, and it then switches off the power supply from the AC/DC converter 193 and halts driving, independently. Consequently, if there is an interruption in the commercial power source (AC 200V), then no drive power is supplied from the nickel hydrogen battery 195 forming the back-up power supply, to the channel adapter 175.

Data received by the channel adapter 175 from the host device (not illustrated), and data read out by the disk adapter 183 from any one of the storage devices 185–191 is respectively held, in a temporary fashion, in the cache memory 177. In the present embodiment, the storage region of the cache memory 177 is divided physically in to a write region (Write Cache) and a read region (Read Cache). The ratio between the write cache and the read cache is generally set to 9:1 or 8:2.

The write cache is a region for temporarily storing data for which the host device (not illustrated) requests storage by the storage control device 171, and hence data transferred from the host device (not illustrated) to the storage control device 171 is written to the write cache by means of the channel adapter 175. On the other hand, the read cache (read region) is a region for temporarily storing data for which the host device (not illustrated) requests reading from the storage control device 171, and hence data read out from any one of the storage devices 185–191 by the disk adapter 183 is written to the read cache, on the basis of a data read out request from the host device (not illustrated).

In the present embodiment, if the commercial power source AC 200V (AC/DC converter 193) is interrupted, then the data stored temporarily in the write cache is withdrawn by transferring it to any one of the storage devices 185–191 from the write cache, by means of the disk adapter 183. However, the aforementioned withdrawal operation is not carried out by the disk adapter 183 with respect to data stored temporarily in the read cache. The reason for this is that the data stored in the write cache is data that has been transferred from the host device (not illustrated), and if the write cache is lost due to a power interruption, then it will be difficult to recover this data, whereas the data stored in the read cache comes from original data stored in one of the storage devices 185–191, and therefore, even if this data is lost from the read cache, due to a power interruption, or the like, it is still fully recoverable.

In the even of an interruption in the commercial power source (AC 200V), the write cache of the cache memory 177 is driven by receiving a power supply from the nickel hydrogen battery 195 forming the back-up power supply, but the read cache of the cache memory 177 is not supplied with power from the nickel hydrogen battery 195. The back-up time period for the (write cache) of the cache memory 177 by means of the nickel hydrogen battery 195 is set to approximately 48 hours.

The address of the write cache and the address of the read cache of the cache memory 177 are written to the shared memory 181, as management information relating to the storage control device 171, for example. The address of the write cache and the address of the read cache are read out, as appropriate, by the disk adapter 183. If the commercial power source (AC 200V) (the AC/DC converter 193) is interrupted, then the write cache address and the read cache address are withdrawn to one of the storage devices 185–191, from the shared memory 181, by the disk adapter 183. In other words, in the aforementioned withdrawal operation, parity data for the write cache address and the read cache address is generated by the disk adapter 183, and this parity data is then transferred by the disk adapter 183, via the switching control section 179, to one of the storage devices 185–191.

Even if the commercial power source (AC 200V) is interrupted, the shared memory 181 is still driven by receiving a power supply from the nickel hydrogen battery 195 forming the back-up power supply. The back-up time period for the shared memory 181 by means of the nickel hydrogen battery 195 is set to approximately 160 hours.

In the present embodiment, for the storage devices 185–191, it is possible to use devices of various types, such as hard disks, flexible disks, magnetic tape, semiconductor memories, optical disks, and the like, for example. If the commercial power source (AC 200V) is normal, for example, then the data stored temporarily in the write cache of the cache memory 177 is written by the disk adapter 183 to the storage devices 185–191. Furthermore, if the commercial power source (AC 200V) is interrupted, then the data stored temporarily in the write cache, and the write cache address and the read cache address stored in the shared memory 181 as described above, and the like, are written to the storage devices 185–191 by the disk adapter 183, as withdrawn data.

Furthermore, the data stored in the storage devices 185–191 is read out from the storage devices 185–191, by the disk adapter 183, as and when appropriate, and stored temporarily in the read cache of the cache memory 177 by the disk adapter 183.

The switching control section 179 forms a data transmission path whereby the channel adapter 175 writes the data received from the host device (not illustrated), to the write cache of the cache memory 177, and a data transmission path whereby the disk adapter 183 writes the data written to the write cache of the cache memory, to any one of the storage devices 185–191. The switching control section 179 also forms a data transmission path whereby the disk adapter 183 writes the parity data of the write cache address and the read cache address held in the shared memory 181, to any of the storage devices 185–191, and a data transmission path whereby the disk adapter 183 writes the data read out from any of the storage devices 185–191, to the read cache of the cache memory 177, in response to a data read request from the host device (not illustrated).

Even if the commercial power source (AC 200V) is interrupted, the switching control section 179 is still driven by receiving a power supply from the nickel hydrogen battery 195 forming the back-up power supply.

The disk adapter 183 comprises a communications port for connecting to the storage devices 185–191, which functions as a disk interface for performing data communications with the storage devices 185–191, and a microcomputer. The disk adapter 183 writes data received by the channel adapter 175 from the host device (not illustrated), to a specified address of any of the storage devices 185–191, on the basis of a (data write) request from the host device (not illustrated), and furthermore, it reads out data from a specified address of any of the storage devices 185–191, on the basis of a (data read) request from the host device (not illustrated), and transfers this data to the host device (not illustrated).

If is confirmed that the commercial power source (AC 200V) has been interrupted, due to a notification from the AC/DC converter 193, for example, then the disk adapter 183 reads out the aforementioned management information including the write cache address and the read cache address, from the shared memory 181. The devices receiving a supply of drive power from the nickel hydrogen battery 195 are designated as: the disk adapter 183 itself, the write cache of the cache memory 177, the switching control section 179, and the shared memory 181. Accordingly, drive power is only supplied by the nickel hydrogen battery 195 to the disk adapter 183, the write cache in the cache memory 177, the switching control section 179, and the shared memory 181, and the power supply from the nickel hydrogen battery 195 to the channel adapter 175, and the read cache of the cache memory 177 is shut off. The sequence of shutting of the power supplies, as performed by the disk adapter 183, is determined in such a manner that none of the parts is damaged by the power shut off procedure.

The plurality of channel adapters (CHA), the cache memory (CACHE), switching control section (CSW), shared memory (SM), plurality of disk adapters (DKA), plurality of storage devices, and AC/DC converter provided in the storage control device 173 are labeled with the same reference numerals as those of the respective parts in on the side of the storage control device 171, and detailed description thereof is omitted here.

As described above, the storage control device 171 illustrated in FIG. 12 differs from the composition of the storage system illustrated in FIG. 1 in respect of the fact that the storage region of the cache memory 177 is divided physically into a write cache and a read cache, and when the commercial power source (AC 200V) is interrupted, drive power is supplied from a nickel hydrogen battery 195 forming the back-up power supply, to the disk adapter 183, the write cache of the cache memory 177, the switching control section 179, and the shared memory 181, only.

Figure 13:
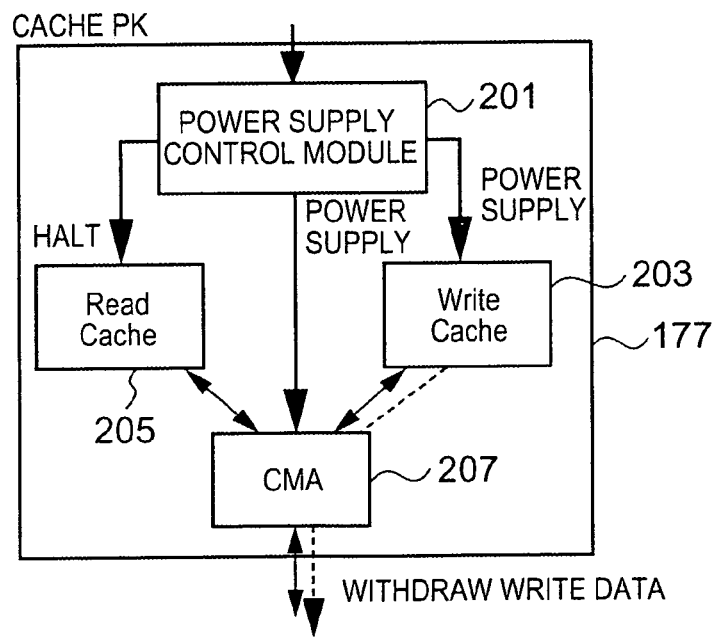
FIG. 13 is a block diagram showing the internal composition of the cache memory illustrated in FIG. 12.

FIG. 13 is a block diagram showing the internal composition of the cache memory 177 illustrated in FIG. 12.

In FIG. 13, the cache memory 177 is divided physically into a write cache 203 and a read cache 205, as described previously. Data is written to the write cache 203, from the host device (not illustrated) accepted by the channel adapter 175, by the cache memory adapter (CMA) 207. The data written to the write cache 203 is transferred to any of the storage devices 185–191, via the cache memory adapter 207 and the disk adapter 183, as and when appropriate. On the other hand, the data read in from any of the storage devices 185–191 by the disk adapter 183 is written to the read cache 205, by the cache memory adapter 207. The data written to the read cache 205 is transferred to the host device (not illustrated), via the cache memory adapter 207 and the channel adapter 175, as and when appropriate.

If the commercial power source (AC 200V) is in a normal state, then drive power is supplied respectively from the AC/DC converter 193, via the power supply control module 201, to the write cache 203, the read cache 205 and the cache memory adapter 207. However, if the supply of drive power switches from the AC/DC converter 193 to the nickel hydrogen battery 195, due to an interruption in the commercial power source (AC 200V), then the power supply control module 201 shuts off the supply of power to the read cache 205, whilst continuing the supply of power to the write cache 203 and the cache memory adapter 207. In this state, the data held temporarily in the write cache 203 is withdrawn to any of the storage devices 185–191, via the cache memory adapter 207 and the disk adapter 183.

In the composition described above, if there is an interruption to the commercial power source (AC 200V), the CPU inside the disk adapter 183 reads in the management information from the shared memory 181, and on the basis of this management information, it judges whether or not the parity data for the write data stored in the storage devices 185–191 is required data. On the basis of the result of this judgment operation, the power supply control module 201 reserves a work area in the cache memory 177 as required in order to generate parity data, and it shuts off the power supply to the storage area of the cache memory 177 which is storing the unnecessary read data.

Thereupon, the disk adapter 183 generates write data and parity data, and furthermore, it executes processing for writing the write data and parity data thus generated, to the storage devices 185–191. In the work area of the cache memory 177 required for generating the write data and the parity data, the power supply control module 201 shuts off the power supply to a portion of the work area that was used to generate write data and parity data, when writing of that data has been completed.

When the whole of the work area used to generate write data and parity data has been shut off, lastly, the disk adapter 183 writes the aforementioned management information to the storage devices 185–191, and when-it has been confirmed that all of the data has been written to the storage devices 185–191, the power supply control module 201 shuts off the power supply to the cache memory 177, completely.

As described above, since the power supply from the nickel hydrogen battery 195 is shut off from the devices which are not related to destage processing by the disk adapter 183 (processing for writing the data in the write cache 203 and the data in the shared memory 181, to one of the storage devices 185–191, whilst receiving a supply of drive power from the nickel hydrogen battery 195,) then it is possible to lengthen the life of the nickel hydrogen battery 195.

Figure 14:
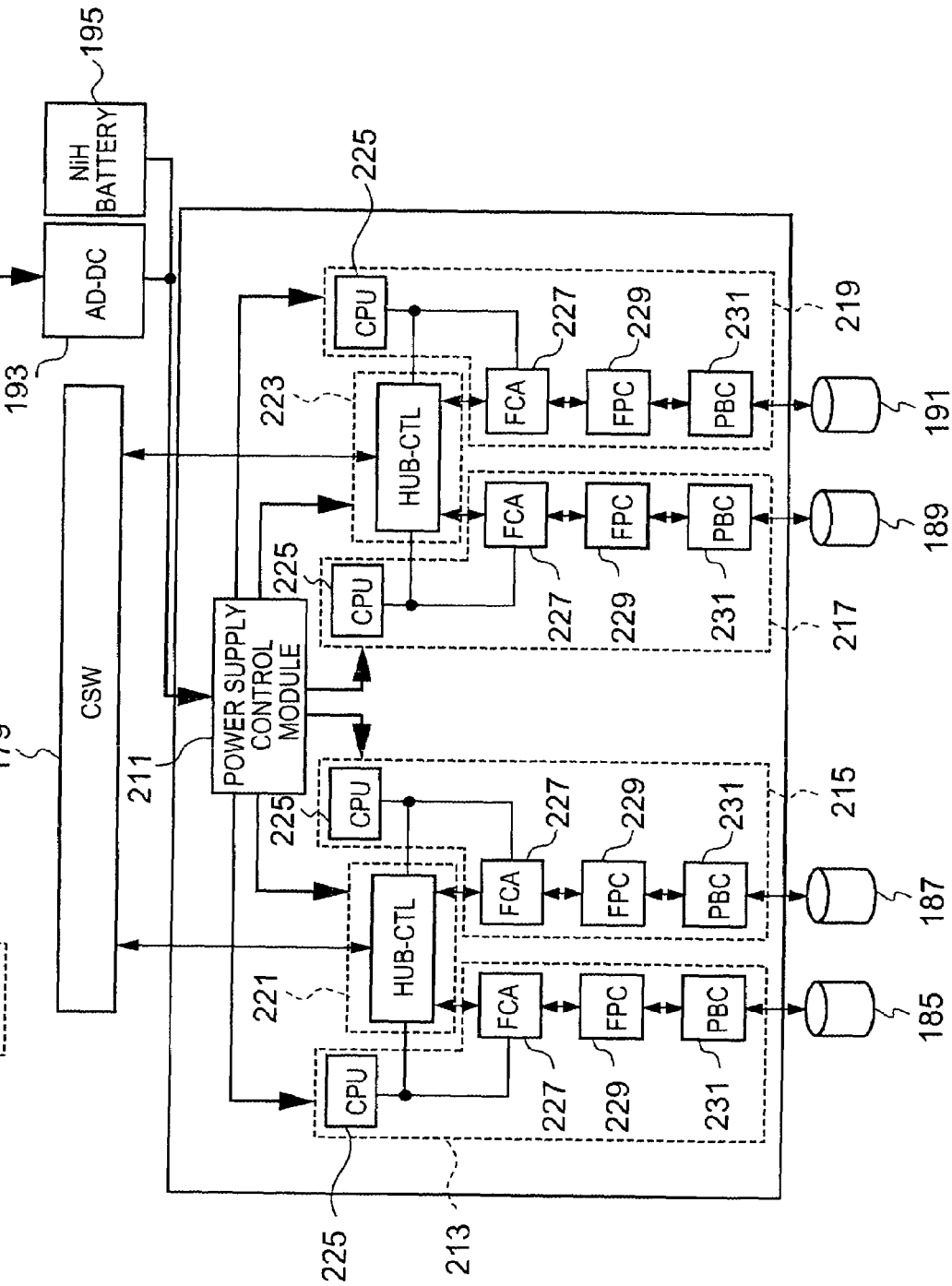
FIG. 14 is a block diagram showing the internal composition of the disk adapter illustrated in FIG. 12.

FIG. 14 is a block diagram showing the internal composition of the disk adapter 183 illustrated in FIG. 12.

As shown in FIG. 14, the disk adapter 183 comprises one power supply control module 211, a plurality of data transfer systems 213, 215, 217, 219 (in FIG. 14, four such systems) having the same composition, and a plurality of hub controllers (HUB-CTL) 221, 223 (in FIG. 14, two such controllers) having the same composition. The respective data transfer systems 213, 215, 217, 219 are provided respectively for each storage device (in FIG. 14, there are four storage devices, labeled 185–191), and each data transfer system (213–219) comprises a CPU 225, a fiber channel adapter (FCA) 227, a fiber channel protocol controller (FPC) 229, and a port bypass circuit (PBC) 231. The controllers 221, 223 are provided respectively for each set of two data transfer systems (213, 215) and (217, 219).

If the commercial power source (AC 200V) is in a normal state, then a drive power is supplied independently, to each of the hub controllers 221, 223 and each of the data transfer systems 213–219, from the AC/DC converter 193, via the power supply control module 211, and if the commercial power source (AC 200V) is interrupted, then drive power is supplied independently to each of the hub controllers 221, 223 and each of the data transfer systems 213–219, from the nickel hydrogen battery 195, via the power supply control module 211.

In each of the data transfer systems (213, 215, 217, 219), the fiber channel adapter 227 has the function of connecting the hub controller 221 (223) and the fiber channel protocol controller 229, under the control of the CPU 225. The port bypass circuit 231 is a switching circuit for connecting the fiber channel protocol controller 229 and the respective storage device (any one of 185–191).

The respective hub controller 221 (223) has a switching function for selecting the storage device (185–191) to which the data transferred from the channel adapter 175 via the switching control section 179 is written, and a function for connecting the switching control section 179 with the fiber channel adapter 227 of either one of the sets of data transfer systems (213, 215) or (217, 219)).

If the commercial power source (AC 200V) is interrupted, then drive power is supplied from the nickel hydrogen battery 195, via the power supply control module 211, to the hub controller (221 or 223) and the data transfer system (213 or 215) or (217 or 219) involved in the aforementioned destage processing, only. For example, if the commercial power source (AC 200V) has been interrupted, and if it is sought to write the data read out from the cache memory 177 via the switching control section 179, to the storage device 185, then the power supply control module 211 shuts off the supply of power to the data transfer systems 215, 217, 219, and the hub controller 223, whilst continuing the supply of power to the data transfer system 213 and the hub controller 221. Shutting off of she power supply is carried out in a similar manner if it is sought to write the data read out from the cache memory 177 via the switching control section 179, to any one of the storage devices 187–191.

As described above, if the commercial power source (AC 200V) is interrupted, then the supply of drive power from the nickel hydrogen battery 195, via the power supply control module 211, to the hub controller (221 or 223) and the data transfer system ((213 or 215) or (217 or 219))

involved in the aforementioned destage processing, is shut off, and therefore the life of the nickel hydrogen battery 195 can be increased.

Figure 15:
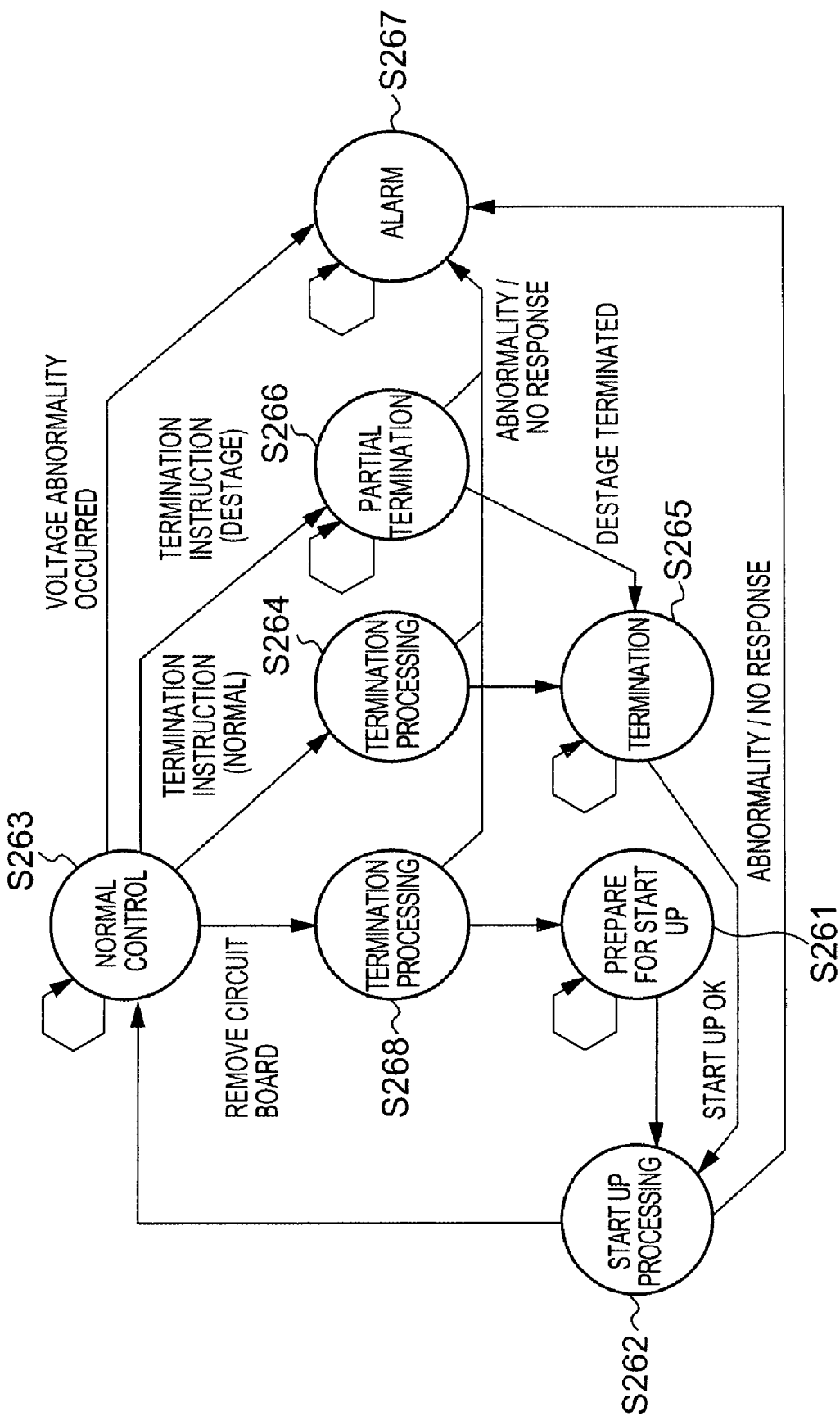
FIG. 15 is an illustrative diagram showing the relationship between the control operations implemented by the power supply control system illustrated in FIG. 2 or FIG. 8, and the control operations implemented by the power supply control module illustrated respectively in FIG. 10, FIG. 13, and FIG. 14.

FIG. 15 is an illustrative diagram showing the relationship between the control operations implemented by the power supply control system illustrated in FIG. 2 or FIG. 8, and the control operations implemented by the power supply control module illustrated respectively in FIG. 10, FIG. 13, and FIG. 14.

Below, the respective control operations illustrated in FIG. 15 are described. Firstly, in the power supply control system shown in FIG. 2, by controlling the hot swap circuit 17, the power supply control circuit 19 starts up the power supplies (DC/DC converters 3–13), in a prescribed sequence (step S261), starts to supply power to the load from the power supplies (DC/DC converters 3–13), and then executes normal control (step S263). In this state of normal control, provided that the power supplies (DC/DC converter 3–13) are normal, termination processing in a normal state (of the power supply) corresponding to this normal control is executed (step S264) on the basis of a termination instructions from the service processor (not illustrated), and the power supplies (DC/DC converters 3–13, and the like) are halted, and normal control is terminated (step S265). However, if the commercial power source is interrupted in the case of the normal control at step S263, then destage processing (step S266) is carried out instead of the normal control, on the basis of a termination instruction from the service processor (not illustrated). Thereupon, at the completion of the aforementioned destage processing, the sequence of processing operations terminates (step S265). At step S265, if the power supply (for example, DC/DC converters 3–13) is switched on again, then the sequence advances to the processing indicated in step S262.

At step S263, if it is recognized that an error has occurred in the output voltage from a power supply (DC/DC converter 3–13) whilst normal control is being implemented, then a report is sent immediately to the host circuit board, for example (the host control circuit 1 shown in FIG. 2, or the like,) to indicate that a voltage error has occurred (step S267). At step S266, if an error has occurred in the output voltage from a power supply (DC/DC converter 3–13), or if a fault has occurred and there is no response, for instance, one of the sections being controlled (for instance, the DC/DC converter 3–13) does not operate at all, even after a prescribed time period has elapsed, then the sequence advances to the processing indicated in step S267. Furthermore, if an error/response failure of this kind is detected at step S264 or step S268, the sequence also advances to the processing indicated in step S267. Moreover, if it is sought to start supply of power to a load from a power supply (for example, DC/DC converter 3–13, or the like), at step S262, and if an error/response failure of the aforementioned kind is detected in the power supply (for example, DC/DC converter 3–13), then the sequence also advances to the processing indicated in step S267.

If the operator issues an instruction, via the service processor (not illustrated), to replace the circuit board due to a breakdown in the power supply control system illustrated in FIG. 2, for example, whilst normal control is being executed at step S263, or if a jumper pin of the circuit board installed in the power supply control system illustrated in FIG. 2 is removed from the main unit (frame) of the storage control device, then processing similar to that indicated in step S264 is carried out (step S268). In this case, a restart is possible by inserting a new circuit board fitted with a power supply control system, into the main unit (frame) of the storage control device (step S261).

Figure 16:
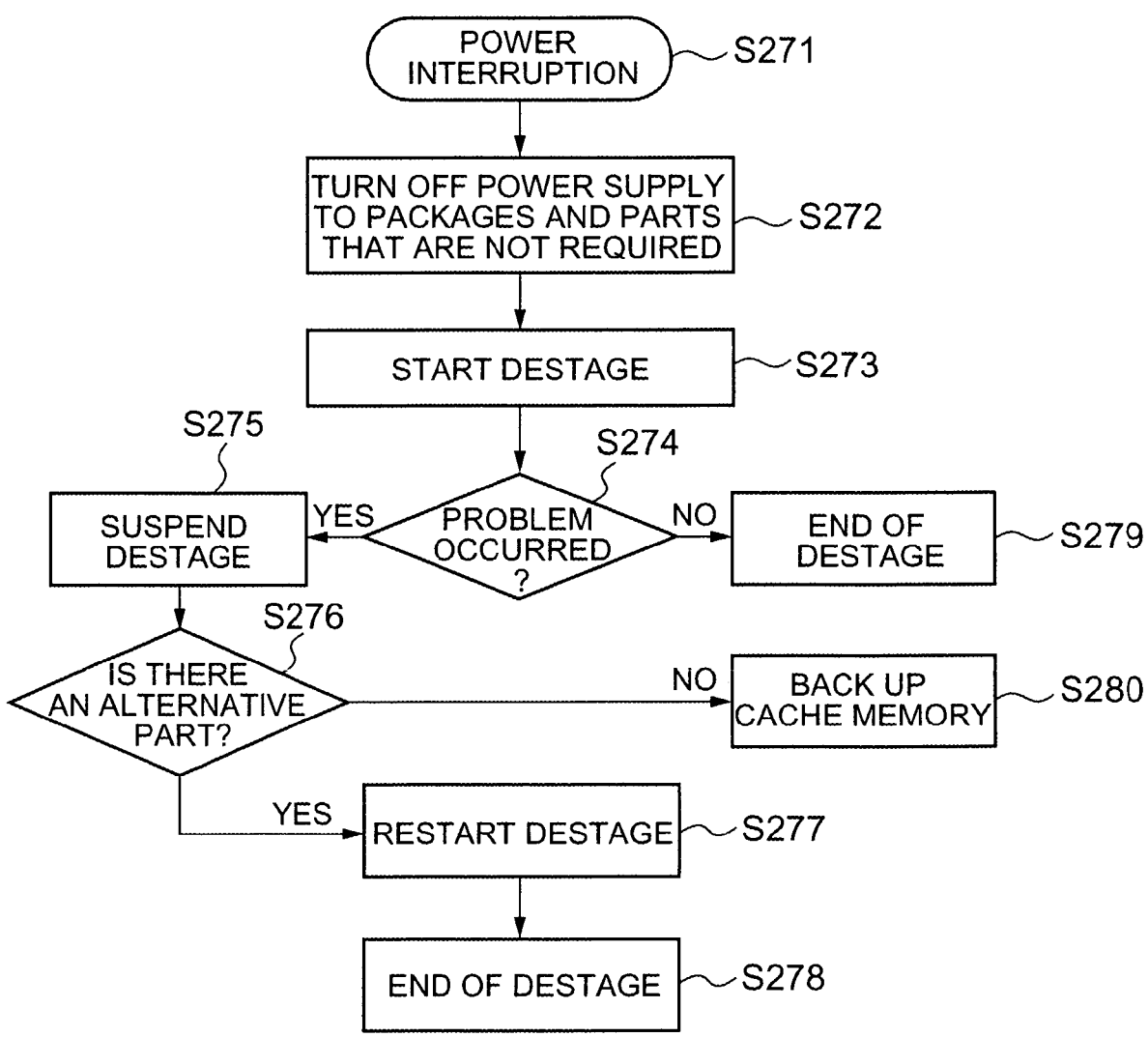
FIG. 16 is a flowchart illustrating operations in a destage process in the case of interruption in the commercial power source, as implemented at step S266 in FIG. 15.

FIG. 16 is a flowchart illustrating operations in a destage process in the case of interruption in the commercial power source, as implemented at step S266 in FIG. 15.

In FIG. 16, if it is recognized that an interruption has occurred in the commercial power source (step S271), then the power supply control module 211 shown in FIG. 14 shuts of the power supply from the nickel hydrogen battery 195 to the devices that are not required for destage processing (step S272). When the power supply has been cut off in this way, the destage process is started, using the data transfer system 213 shown in FIG. 14, for example (step S273). If a problem of any kind occurs in the data transfer system 213 during the execution of this destage processing (YES at step S274), then the destage process carried out by the data transfer system 213 that was started at step S273 is suspended (step S275), and it is checked whether or not there exists a data transfer system which could be used in place of the data transfer system (213) that has generated a problem (step S276).

Here, since there is a mutually compensatory relationship between the data transfer system 215 and the data transfer system 213 (YES at step S276), the destage processing suspended at step S275 is restarted by using the data transfer system 215 which is not affected by a problem, instead of the data transfer system 213 which has generated a problem (step S277). By concluding the destage processing restarted in this manner, the sequence of processing operations illustrated in FIG. 16 is completed (step S278).

If no problem occurs in the data transfer system 213 during execution of destage processing (NO at step S274), then with the completion of the disease process, the sequence of processing operations shown in FIG. 16 terminates (step S279). If it is supposed that there is no data transfer system which can be used in place of the data transfer system (213) that has generated a fault (NO at step S276), then the power supply control module 211 causes the back-up power supply from the nickel hydrogen battery 195 to be supplied to the cache memory (177) (shown in FIG. 12) only (step S280).

In the foregoing description, it is supposed that a nickel hydrogen battery is used as the back-up power supply, but there is no obstacle of any kind to using a lead accumulator battery, or a lithium ion battery, instead of a nickel hydrogen battery.

Preferred embodiments of the present invention were described above, but these are examples for the purpose of describing the present invention, and the scope of the present invention is not limited to these embodiments alone. The present invention may be implemented in various further modes.

What is claimed is:

1. A power supply control system, comprising:
   a plurality of power supply circuits for supplying externally a plurality of different drive voltages to loads in a disk array unit driven at the plurality of drive voltages, respectively;
   a data holding section for holding detected output voltage value data from each of said power supply circuits, separately for each of said power supply circuits, until said data is updated by newly detected output voltage value data from each of said power supply circuits;
   an error reporting section for checking whether or not the output voltage from each of said power supply circuits is abnormal, separately for each of said power supply circuits, and outputting an error report signal to identify in which power supply circuit the error occurred, if there is a power supply circuit which is judged to be abnormal; and a data update prohibiting section for prohibiting updating of said output voltage value data in said data holding section, if said error report signal is output by said error reporting section, and storing the output voltage value data prior to the occurrence of said error, in a storage section.

2. The power supply control system according to claim 1, wherein output voltage value data is sampled at a prescribed frequency of cycles and then stored in said data holding section as said detected output voltage vaule data, and said prescribed frequency of cycles is a number of cycles required to analyze an error occurring in any of said power supply circuits.

3. The power supply control system according to claim 1, wherein said data holding section and said storage section are the same storage media, or separate storage media, and said storage section is a non-volatile memory.

4. The power supply control system according to claim 1, further comprising a plurality of voltage detecting sections for detecting the output voltage from each of said power supply circuits, provided respectively for each of said power supply circuits;

wherein said error reporting section and said respective voltage detecting sections are respectively connected by a signal transmission path.

5. The power supply control system according to claim 4, wherein said error reporting section judges whether or not an error has occurred in any one of said power supply circuits, by comparing the output voltage value data transmitted from each of said voltage detecting sections via said respective signal transmission paths, with voltage threshold value data corresponding to each of the output voltage value data, of voltage threshold value data for judging whether or not said output voltage value data set separately for each of said power supply circuits is abnormal.

6. The power supply control system according to claim 5, wherein said error reporting section and said data update prohibiting section are connected by means of a plurality of signal transmission paths provided corresponding to each of said signal transmission paths connecting said error reporting section respectively with each of said voltage detecting sections.

7. The power supply control system according to claim 6, wherein, if the output voltage value data transmitted from any one of said voltage detecting sections via the signal transmission path corresponding to said voltage detecting section is judged to be abnormal, said error reporting section transmits said error report signal to said data update prohibiting section via the signal transmission path corresponding to said signal transmission path, of the plurality of signal transmission paths connecting said error reporting section and said data update prohibiting section.

8. The power supply control system according to claim 1, wherein the driving of each of said power supply circuits is halted in a sequence whereby no damage is caused to the elements of the host control circuit which is the load, if said data update prohibiting section inputs an error report signal from said error reporting section.

9. The power supply control system according to claim 1, wherein said data update prohibiting section reports the fact that an error has occurred in any one of said power supply circuits, to the host control circuit or the host circuit board, which is the load, if said data update prohibiting section inputs an error report signal from said error reporting section.

10. The power supply control system according to claim 1, further comprising:

a temperature detecting section for detecting the temperature inside said system; and a fan for cooling the interior of said system;

wherein the startup of said fan, increase in the rotational speed of said fan, and halting of the driving of said respective power supply circuits, are controlled stepwise, in accordance with a temperature detection value from said temperature detecting section.

* * * * *